United States Patent
Gilbert

(10) Patent No.: US 7,327,183 B2
(45) Date of Patent: *Feb. 5, 2008

(54) SQUARING CELLS AND MULTIPLIERS USING SUMMED EXPONENTIALS

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 149 days.

This patent is subject to a terminal disclaimer.

(21) Appl. No.: 10/766,514

(22) Filed: Jan. 27, 2004

(65) Prior Publication Data

US 2004/0239398 A1 Dec. 2, 2004

Related U.S. Application Data

(60) Continuation of application No. 10/192,115, filed on Jul. 9, 2002, now Pat. No. 6,861,890, which is a division of application No. 09/473,309, filed on Dec. 28, 1999, now Pat. No. 6,437,630, and a division of application No. 10/319,368, filed on Dec. 12, 2002, now Pat. No. 6,696,888, which is a division of application No. 10/170,067, filed on Jun. 11, 2002, now Pat. No. 6,525,601, which is a division of application No. 09/569,544, filed on May 12, 2000, now Pat. No. 6,429,720.

(51) Int. Cl.
*G06F 7/44* (2006.01)

(52) U.S. Cl. ...................... 327/349; 327/356

(58) Field of Classification Search ................ 327/100, 327/103, 346–357, 360, 361, 349
See application file for complete search history.

(56) References Cited

U.S. PATENT DOCUMENTS

| 4,047,235 A | 9/1977 | Davis ....................... 361/100 |
| 5,077,541 A | 12/1991 | Gilbert ...................... 330/284 |
| 5,107,150 A | 4/1992 | Kimura ..................... 327/349 |
| 5,298,811 A | 3/1994 | Gilbert ...................... 327/351 |
| 5,359,293 A | 10/1994 | Boksiner et al. ............ 324/544 |
| 5,432,478 A | 7/1995 | Gilbert ...................... 330/284 |
| 5,473,244 A | 12/1995 | Libove et al. .............. 324/126 |
| 5,684,431 A | 11/1997 | Gilbert et al. .............. 330/254 |

(Continued)

FOREIGN PATENT DOCUMENTS

EP 0 665 639 AI 8/1995

OTHER PUBLICATIONS

Gilbert, Barrie; Wideband Negative-Current Mirror; *Electronics Letters*; vol. 11, No. 6, Mar. 20, 1975; pp. 126-127.

(Continued)

*Primary Examiner*—Kenneth B. Wells
*Assistant Examiner*—Ryan Jager
(74) *Attorney, Agent, or Firm*—Marger Johnson & McCollom, PC

(57) ABSTRACT

A squaring cell combines first and second exponential currents to approximate square law behavior. The exponential currents can be generated by current stacks having pairs of series-connected junctions. The exponential currents can be altered to change the shape of the exponential currents to better approximation true square law behavior. A multiplier combines four exponential currents to approximate a multiplication function. The exponential currents in the multiplier can be generated by current stacks that are cross-connected so as to generate two output currents, the difference of which represents the multiplication of two input signals.

25 Claims, 15 Drawing Sheets

U.S. PATENT DOCUMENTS

| | | | |
|---|---|---|---|
| 5,714,911 A | 2/1998 | Gilbert | 331/57 |
| 5,909,136 A * | 6/1999 | Kimura | 327/356 |
| 6,052,349 A | 4/2000 | Okamoto | 369/47.26 |
| 6,173,346 B1 * | 1/2001 | Wallach et al. | 710/302 |
| 6,204,719 B1 | 3/2001 | Gilbert | 327/349 |

OTHER PUBLICATIONS

Gilbert, Barrie; *Current-mode Circuits From A Translinear Viewpoint: A Tutorial*; Analogue IC design: the current mode approach; Peter Peregrinus, Ltd., London, United Kingdom; 1990 (pp. 11-91).

Analog Devices *High Precision, Wide-Band RMS-to-DC Converter (AD637)* Rev. E. 10 pages, 1999.

Analog Devices data sheets entitled "Dual, Low Noise, Wideband Variable Gain Amplifiers", AD600/AD602, Rev. A, 20 pages, published Apr. 1992.

Analog Devices data sheets entitled "Low Level, True RMS-to-DC Converter", AD636, Rev. A, 8 pages, published Sep. 1992.

Analog Devices data sheets for *60 MHz, 2000 V/µS Monolithic Op Amp AD844*, 12 pages, 1990.

* cited by examiner

SQUARING CELLS AND MULTIPLIERS USING SUMMED EXPONENTIALS

This application is a continuation of prior application Ser. No. 10/192,115, filed Jul. 9, 2002, now U.S. Pat. No. 6,861,890 which is a divisional of prior application Ser. No. 09/473,309, filed Dec. 28, 1999, which is now U.S. Pat. No. 6,437,630, which are herein incorporated by reference; this application is also a divisional of prior application Ser. No. 10/319,368, filed Dec. 12, 2002, now U.S. Pat. No. 6,696,888 which is a divisional of prior application Ser. No. 10/170,067 filed Jun. 11, 2002, now U.S. Pat. No. 6,525,601, which is a divisional of prior application Ser. No. 09/569,544 filed May 12, 2000, which is now U.S. Pat. No. 6,429,720B1 issued Aug. 6, 2002, which are herein incorporated by reference.

BACKGROUND OF THE INVENTION

1. Field of the Invention

The present invention relates generally to RMS-DC converters, and more particularly, to RMS-DC converters, which utilize gain stages and variable weighting coefficients to provide a very wide measurement range.

2. Description of the Related Art

RMS-DC converters are used to convert the RMS (root-mean-square) value of an arbitrary signal into a quasi-DC signal that represents the true power level of the signal. Various techniques have been devised for performing RMS-to-DC conversions at frequencies ranging from DC to several GHz, some of which are disclosed in co-pending U.S. patent application Ser. No. 09/245,051 filed Feb. 4, 1999, which is now U.S. Pat. No. 6,204,719, and Ser. No. 09/256,640 filed Feb. 24, 1999, which is now U.S. Pat. No. 6,172,549, which are by the same inventor as the present application, and are incorporated herein by reference.

Performing accurate RMS-DC conversions over a wide dynamic range has proven difficult, especially at RF frequencies of several GHz. The need for wide dynamic range true-power measurement at very high frequencies has become more critical because the signals generated by modern communications systems such as those using CDMA have very wide instantaneous bandwidth and complex waveforms, with high crest factors, and because operating frequencies are continuously being pushed higher.

Logarithmic amplifiers (log amps) are often used to measure the power of RF signals because they can provide a good indication of power over a very wide bandwidth, but the measurement depends on the waveform of the RF signal. Synchronous log amps are of special interest in this regard because they reduce the noise floor compared to other log amps, and therefore, provide extended dynamic range. A synchronous log amp is disclosed in U.S. Pat. No. 5,298,811 which issued to the inventor of the present application and which are incorporated by reference.

However, logarithmic amplifiers, including synchronous log amps, do not provide an RMS response. When a signal of substantial amplitude is applied to a log amp, most of the amplifier cells operate in a limiting mode, which precludes the attainment of a square-law response in the constituent detector cells, or in the sum of their outputs.

SUMMARY

In one aspect of the present invention, a series of cascaded gain stages generate a series of progressively amplified signals, which are squared and weighted and then summed to provide a true square-law response. In another aspect of the present invention, two parallel series of cascaded gain stages generate a series of progressively amplified signal pairs, which are multiplied and weighted and then summed to provide a true square-law response while also canceling uncorrelated noise. In a further aspect of the present invention, two signals are generated by exponential signal generators responsive to an input signal, and combined to provide an output signal, which approximates the squared value of the input signal. In another aspect of the present invention, four signals are generated by exponential signal generators responsive to two input signals, and combined to provide an output signal, which approximates the multiplication of the input signals. In an additional aspect of the present invention, an exponential signal is generated responsive to an input signal by maintaining a constant current in a first pair of series-connected junctions, thereby generating a first voltage across the first pair of junctions; and driving a second pair of series-connected junctions with a voltage equal to the first voltage minus the voltage of the signal.

DETAILED DESCRIPTION

Figure 1:
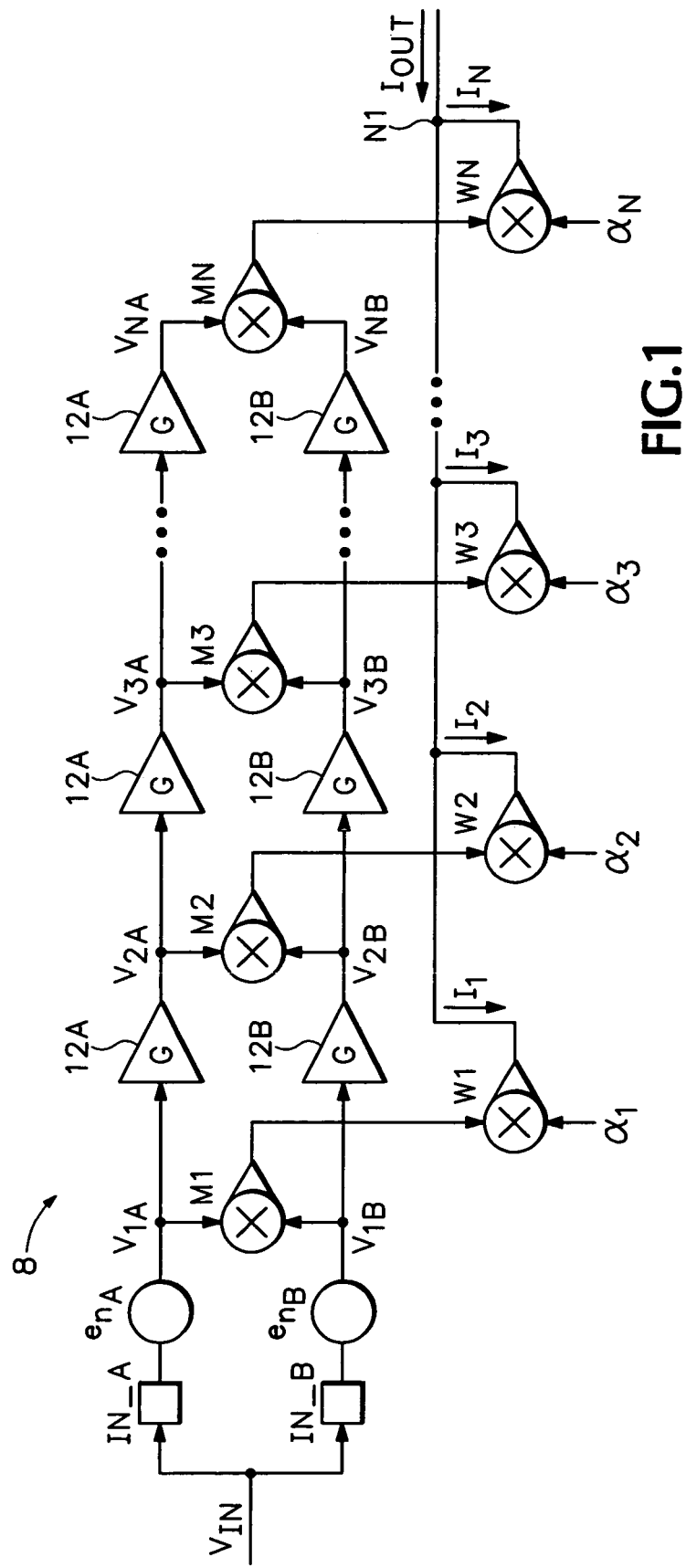
FIG. 1 is a simplified schematic of an embodiment of a backbone of an RMS-DC converter in accordance with the present invention.

FIG. 1 is a simplified schematic of an embodiment of a backbone of an RMS-DC converter 8 in accordance with the present invention. The system of FIG. 1 includes a first chain or series of gain stages 12A, a second series of gain stages 12B, a first series of four quadrant multipliers M1, M2 . . . MN, and a second series of weighting multipliers W1, W2, . . . WN which only need to operate in two quadrants.

The first series of gain stages are connected in a cascade arrangement and generate a first series of progressively amplified signals $V_{kA}$ (k=1 . . . N) in response to the input voltage $V_{IN}$. Likewise, the second series of gain stages generate a second series of progressively amplified signals $V_{kB}$ (k=1 . . . N) in response to $V_{IN}$. The signals $V_{1A}$ and $V_{1B}$ are simply the input voltage $V_{IN}$ (plus the noise from sources $e_{nA}$ and $e_{nB}$ as described below). The first series of multipliers are coupled to the first and second series of gain stages so that each multiplier Mk generates an output signal in response to the corresponding mplified signals $V_{kA}$ and $V_{kB}$. Noise source system but are shown connected in series with the inputs of the first and second series of gain stages to represent the total input-referred thermal noise of each amplifier and to aid in explaining the effects of the thermal noise on the operation of the system of FIG. 1 as described below.

The outputs from the first series of multipliers are coupled to the second series of multipliers W1, W2, . . . WN. Each of the second multipliers Wk multiplies the output from the corresponding first multiplier by a corresponding weighting signal $\alpha_k$ to generate a weighted output current $I_k$. The value of the weighting signal $\alpha_k$ therefore acts as a weighting coefficient for the kth pair of amplified signals $V_{kA}$ and $V_{kB}$ and their product $V_{kA}V_{kB}$. The series of weighted output currents $I_1, I_2, \ldots I_N$ from the multipliers Wk are then summed at a summing node N1 to generate the summed output current $I_{OUT}$. Each pair of corresponding multipliers $M_k$ and $W_k$ can be viewed as forming a combined multiplier/weighting stage.

An advantage of implementing the output signals $I_k$ as currents is that they can be summed by simply combining the currents at a summing node N1. However, the present invention is not limited to embodiments in which the signals are realized as specific voltages or currents. For example, the multiplier/weighting stages could be implemented so that their output signals are in the form of voltages. In this case, the summing circuit could not be a simple summing node, but would need to be a more complicated circuit capable of summing several voltage signals. As another example, the input signal is shown as a voltage $V_{IN}$, however, implementations in which the input signal is applied as a current are possible. For purposes of explanation, the signals $V_{IN}$, $V_{kA}$ and $V_{kB}$ are hereinafter assumed to be voltages, and the weighted output signals $I_k$ are hereinafter assumed to be current-mode signals.

The operation of the system of FIG. 1 will now be described by first considering the multipliers Mk and Wk. In the current-mode, the output current from Wk is the full product $$I_k = \alpha_k V_{kA} V_{kB} \quad \text{(Eq. 1)}$$

where $\alpha_k$ is correctly dimensioned. Assuming the input voltage $V_{IN}$ is applied equally to both series of gain stages, and neglecting at this point the thermal noise of the circuit (represented by $e_{nA}$ and $e_{nB}$), then $V_{kA}=V_{kB}=V_k$, and the weighted output of the k-th multiplier is $$I_k = \alpha_k V_k^2 \quad \text{(Eq. 2)}$$

The total output is thus $$I_{OUT} = \alpha_1 V_1^2 + \alpha_2 V_2^2 + \ldots + \alpha_N V_N^2 = \sum_{k=1}^{N} \alpha_k V_k^2 \quad \text{(Eq. 3)}$$

Since the amplification between each stage is G, and assuming the amplifiers are fully linear, the total output (again ignoring noise) is simply $$I_{OUT} = \alpha_1 V_{IN}^2 + \alpha_2 (GV_{IN})^2 + \ldots + \alpha_N (G^{N-1} V_{IN})^2 \quad \text{(Eq. 4)}$$
$$= \sum_{k=1}^{N} \alpha_k (G^{k-1} V_{IN})^2$$

When the amplifiers are fully linear, $V_{IN}^2$ can be extracted as follows $$I_{OUT} = V_{IN}^2 \sum_{k=1}^{N} \alpha_k G^{2(k-1)} \quad \text{(Eq. 5)}$$

showing that the system exhibits a square-law response to $V_{IN}$. However, in a practical system, the amplifiers 12A and 12B are not fully linear, but exhibit a limiting function as described below with reference to FIGS. 8 and 9. In a practical amplifier, large inputs will cause later stages in each chain to limit.

To preserve the square-law response over a wide range of input voltages, the system is servoed by adjusting the weighting signals $\alpha_1, \alpha_2, \ldots \alpha_N$ so that most of the weighting signals are essentially zero, thereby disabling most of the multiplier/weighting stages. Those left in operation respond to a linear replica of the inputs.

With the maximum input signal, the system servoes by adjusting the weighting signals so that only the first multiplier/weighting stage is enabled. That is, $\alpha_1$ adjusts to a suitable full scale value $\alpha_{FS}$, and $\alpha_2, \alpha_3, \ldots \alpha_N$ are all set to zero, or very nearly zero as described below. This prevents errors due to a loss of the square-law response, which would be caused by limiting in the higher-numbered gain stages or multipliers. For smaller input signals, the system servoes by adjusting the weighting signals. Over the full input signal range, progressively higher numbered multiplier/weighting stages are enabled and then disabled as the signal decreases, until finally, with a very small input signal, the weighting signals are adjusted so that only the last multiplier/weighting stage is enabled, and the remainder are disabled (i.e., $\alpha_1, \alpha_2, \ldots \alpha_{N-1}$ are all set to zero, and $\alpha_N$ is set to $\alpha_{FS}$).

In a practical embodiment, the weighting signals are generated by an interpolator such as that described below with reference to FIG. 2 which does not completely turn off the weighting signals that are set to zero. Instead, they are reduced to a finite, but very small value. Also, the weighting signals "closest" to the large-valued signal may be significantly greater than zero.

With a small input signal, the combined gain $G^{N-1}$ of the N−1 amplifiers in each series of gain stages raises the small input signal to one of substantial amplitude $G^{N-1}V_{IN}$ and provides a usefully strong drive $V_{NA}$ and $V_{NB}$ to the last multiplier MN. Since only the last multiplier/weighting stage is enabled in response to a sufficiently small input signal, the summed output current for that condition is:

$$I_{OUT} = \alpha_{FS}G^{2(N-1)}V_{IN}^2 \quad \text{(Eq. 6)}$$

The signals $V_{kB}$ always have the same waveform as the input signal $V_{IN}$ in theory. However, they are also affected in practice by the thermal noise generated internally within the system. This noise is represented in FIG. 1 by sources $e_{nA}$ and $e_{nB}$, which have essentially the same RMS amplitude, but are fully uncorrelated. This noise affects the waveforms of $V_{kA}$ and $V_{kB}$ by vector summation with $V_{IN}$ as follows:

$$V_{kA} = G^{k-1}\sqrt{V_{IN}^2 + e_{nA}^2} \quad \text{(Eq. 7)}$$

$$V_{kB} = G^{k-1}\sqrt{V_{IN}^2 + e_{nB}^2} \quad \text{(Eq. 8)}$$

Their cross-product after weighting is thus $$I_{OUT} = \alpha_{FS}G^{2(k-1)}\sqrt{V_{IN}^2 + e_{nA}^2}\sqrt{V_{IN}^2 + e_{nB}^2} \quad \text{(Eq. 9)}$$

which can be manipulated as follows:

$$I_{OUT} = \alpha_{FS}G^{2(k-1)}V_{IN}^2\sqrt{1 + \left(\frac{e_{nA}}{V_{IN}}\right)^2}\sqrt{1 + \left(\frac{e_{nB}}{V_{IN}}\right)^2} \quad \text{(Eq. 10)}$$

Then, using the approximation $$\sqrt{1+x} \approx 1 + \frac{x}{2}$$

when x is small:

$$I_{OUT} = \alpha_{FS}G^{2(k-1)}V_{IN}^2\left[1 + \left(\frac{e_{nA}}{2V_{IN}}\right)^2\right]\left[1 + \left(\frac{e_{nB}}{2V_{IN}}\right)^2\right] \quad \text{(Eq. 11)}$$

which can be expanded to:

$$I_{OUT} = \alpha_{FS}G^{2(k-1)}V_{IN}^2\left[1 + \left(\frac{e_{nA}}{2V_{IN}}\right)^2 + \left(\frac{e_{nB}}{2V_{IN}}\right)^2 + \delta\right] \quad \text{(Eq. 12)}$$

where $\delta$ is a very small residue, which can be ignored. Then, $$\begin{aligned}I_{OUT} &= \alpha_{FS}G^{2(k-1)}V_{IN}^2\left[1 + \left(\frac{e_n}{V_{IN}}\right)^2\right] \\ &= \alpha_{FS}G^{2(k-1)}[V_{IN}^2 + e_n^2]\end{aligned} \quad \text{(Eq. 13)}$$

where $e_{nA} = e_{nB} = e_n$, and $\delta$ is disregarded. The baseline output in the absence of any applied signal $V_{IN}$ is then $$I_{OUT} = \alpha_{FS}G^{2(k-1)}e_n^2 \quad \text{(Eq. 14)}$$

This always represents a miniscule instantaneous current, but with the dual amplifier scheme shown in FIG. 1, the cross-product averages asymptotically to zero over a sufficiently long interval because of the lack of coherence or correlation between the two noise signals $e_{nA}$ and $e_{nB}$. Furthermore, even when averaged over a finite, moderate interval, the effective noise bandwidth is that of a low-pass filter (described below) which is used to extract the average from $I_{OUT}$. This is in very strong contrast to a single amplifier having a squared noise $I_{OUT} = \alpha_{FS}G^{(N-1)}e_n$ wherein the net demodulated noise is that of the full-bandwidth signal, thereby imposing significant limitations on the dynamic range.

Figure 2:
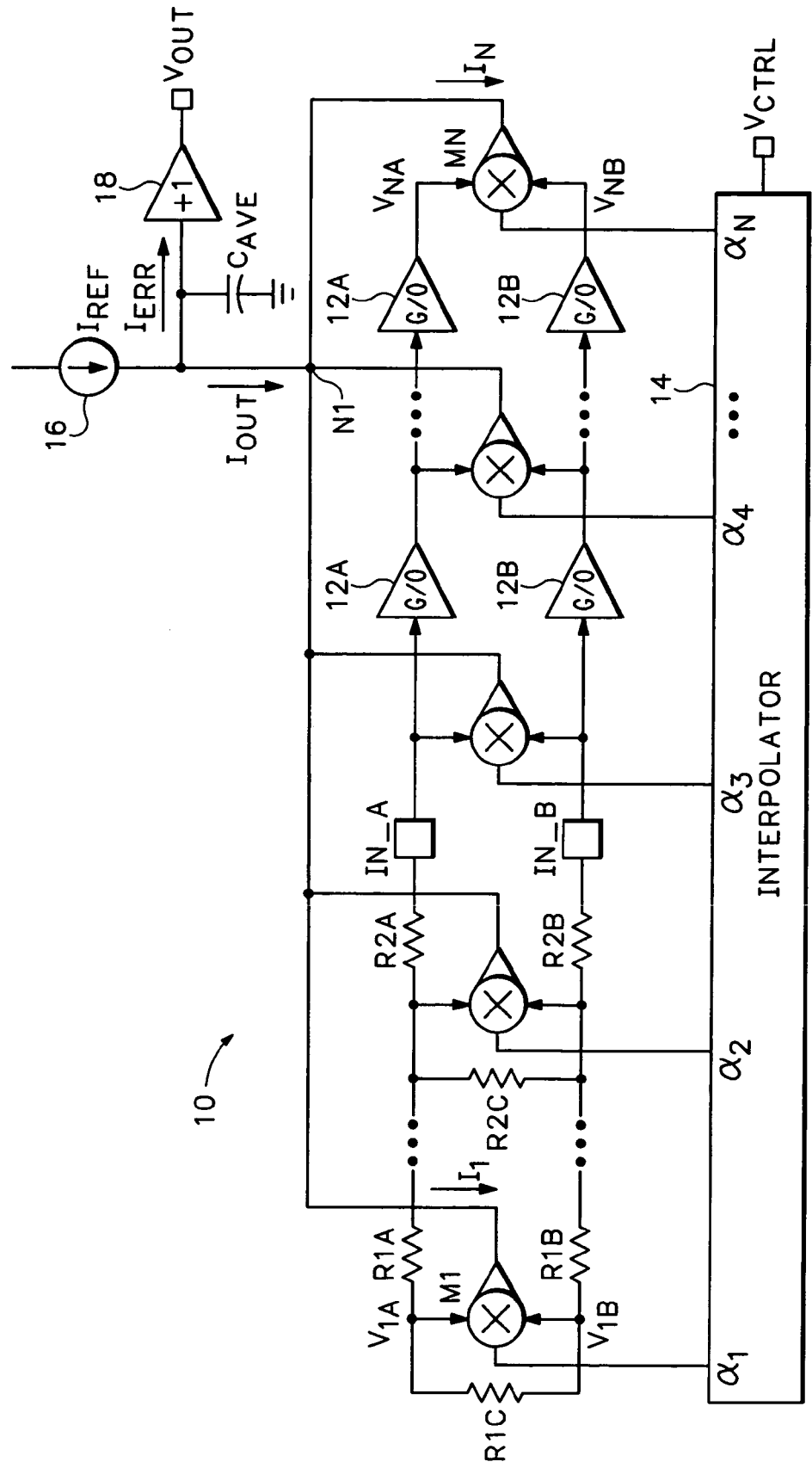
FIG. 2 is a simplified schematic of an embodiment of an RMS-DC converter in accordance with the present invention, which utilizes a backbone similar to that of FIG. 1.

FIG. 2 is a simplified schematic of an embodiment of an RMS-DC converter 10 in accordance with the present invention. The system of FIG. 2 includes a backbone similar to that of FIG. 1, but each multiplier/weighting stage is implemented more efficiently as a single multiplier having a third input for scaling the multiplication in response to the corresponding weighting signal. Thus, the multiplication and weighting functions are combined in a single cell. This cell will typically, though not necessarily, have a transconductance form, producing a current output. The outputs of the multipliers may therefore be coupled directly together at summing node N1 to generate the complete output current $I_{OUT}$.

Another difference is that the lower numbered "gain" stages are now implemented as attenuators rather than amplifiers. For example, the lowest gain stage includes resistors R1A, R1B, and R1C. The output signals from the attenuators are still referred to as amplified signals, although they are "amplified" with a gain of less than one. By implementing some of the gain stages as attenuators, the system can accommodate larger input signals. Therefore, the total number of weighting stages can be increased and the dynamic range of the system can be extended even further. It should also be noted that any suitable number of both the attenuator-type gain stages and the amplifier-type gain stages can be used, including zero in either case, depending on the total input signal range required, and the gain or attenuation at each stage may have any suitable value. A typical value may be 10 dB. Thus a total of ten gain and weighting stages provides an overall dynamic range of 100 dB.

The system of FIG. 2 also includes an averaging circuit and an interpolator 14. The averaging circuit includes a capacitor $C_{AVE}$, which is coupled between the summing node N1 and power supply ground GND, a current source 16 which provides a reference current $I_{REF}$ to the summing node N1, and an optional unity gain buffer amplifier 18 which buffers the voltage across $C_{AVE}$ to provide the final output voltage $V_{OUT}$.

Referring again to FIG. 2, the interpolator 18 generates the weighting signals $\alpha_1, \alpha_2, \ldots \alpha_N$ in response to the control signal $V_{CTRL}$. In a preferred embodiment, the weighting signals are a series of continuous, overlapping Gaussian-shaped current pulses having a centroid whose location moves along the length of the interpolator as $V_{CTRL}$ is varied so that most of the weighting signals are nearly zero, but adjacent stages near the centroid are enabled to some extent. Also, the sum of all the weighting coefficients are typically, though not necessarily, a constant value $\alpha_{FS}$:

$$\sum_{k=1}^{N} \alpha_k = \alpha_{FS} \qquad \text{(Eq. 15)}$$

An interpolator capable of generating Gaussian-shaped current pulses meeting these requirements is disclosed in U.S. Pat. No. 5,077,541 by the same inventor as the present application. In a preferred embodiment, the interpolator is of the type described in U.S. patent application Ser. No. 09/466,050, filed Dec. 17, 1999, which is now U.S. Pat. No. 6,489,849, entitled "Interpolator Having Dual Transistor Ranks and Ratiometric Control" by the same inventor as the present application and which is incorporated by reference.

The use of Gaussian-shaped weighting signals produces a small sinusoidal ripple in the error between the actual response of the system and the response of an ideal RMS measurement system. A linear interpolator such as that disclosed in U.S. Pat. No. 5,432,478, also by the same inventor as the present application, could be used, but would result in a larger, quadratic ripple in the output function.

Figure 9:
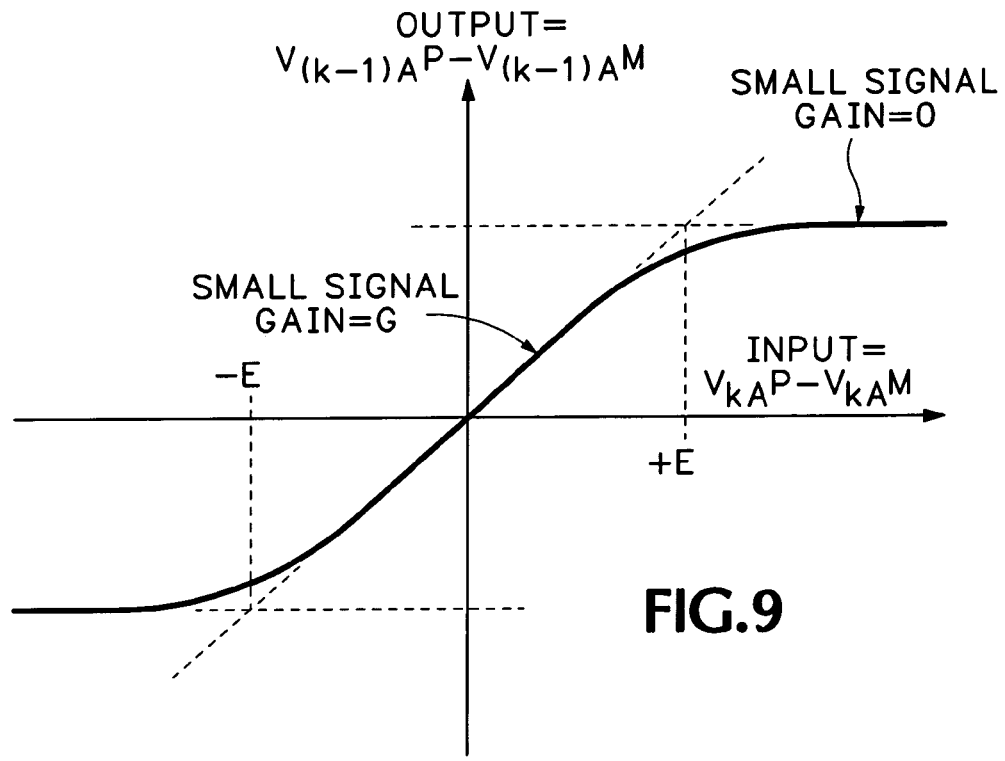
FIG. 9 shows the large-signal gain function of the wideband amplifier cell of FIG. 8.

In the embodiment of FIG. 2, the gain stages 12A and 12B are implemented as "G/0" cells or "limiting" cells. That is, the incremental gain is G in response to very small signals, but then falls off to zero as the signal increases in magnitude, as shown in FIG. 9. (These G/0 cells are also referred to as "A/0" cells in other patents and the inventor's literature). The gain stages can be implemented as simple bipolar pairs, in which case the large-signal function is a hyperbolic tangent function (tanh), and the incremental gain has a hyperbolic secant-squared (sech$^2$) form. However, it might be useful to provide a more linear gain function, so multi-tanh cells can be used. Examples of multi-tanh cells are described in U.S. patent application Ser. No. 09/212,089 filed Dec. 15, 1998, which is now U.S. Pat. No. 6,087,883, and Ser. No. 09/015,614 filed Jan. 29, 1998, which is now U.S. Pat. No. 6,084,472. Alternatively, the small-signal linearity can be improved using emitter degeneration or any other suitable technique. It should also be noted that the gain stages do not need to be specifically of the limiting type in order for the principles of the present invention to be realized, although all practical amplifiers will eventually reach limiting operation.

As with the multipliers Mk and Wk in FIG. 1, the multipliers Mk in FIG. 2 are preferably implemented with current outputs to facilitate the summation of their weighted output currents $I_k$, which can be performed by a simple wire connection at a summing node rather than requiring a more complicated summing circuit. However, the present invention is not limited to embodiments having current outputs.

Figure 5:
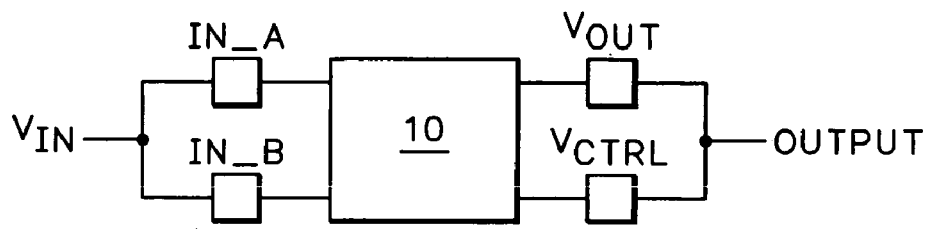
FIG. 5 is a simplified schematic showing how the system of FIG. 2 can be configured for operation in a measurement mode in accordance with the present invention.

The system of FIG. 2 can be configured for operation in a measurement mode as shown in FIG. 5, in which case the signal to be measured is applied as the input $V_{IN}$, and the final output voltage $V_{OUT}$ is used as a feedback signal by coupling it back to the interpolator as the control signal $V_{CTRL}$. With this connection, the system automatically servoes by adjusting the weighting signals until the average value of the output current $I_{OUT}$ is equal to the reference current $I_{REF}$. The output voltage $V_{OUT}$ then indicates the logarithm of the RMS value of the input signal, that is, the output is a linear-in-dB measure of the power of the input signal.

Figure 6:
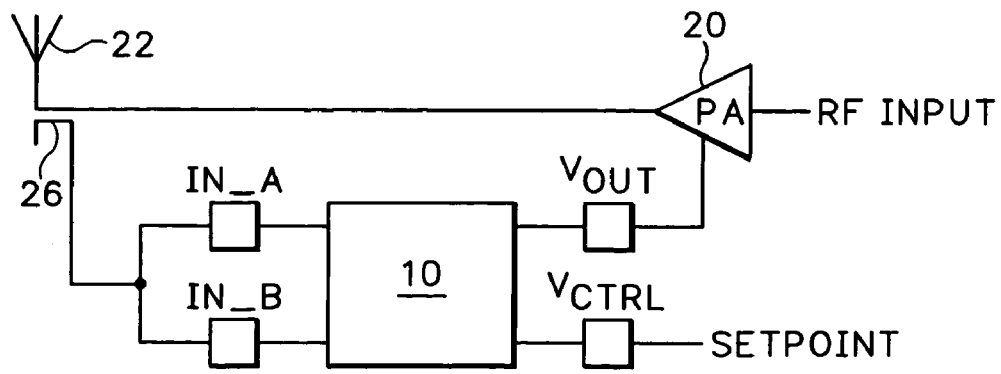
FIG. 6 is a simplified schematic showing how the system of FIG. 2 can be configured for operation in a controller mode in accordance with the present invention.

Alternatively, the system of FIG. 2 can be configured to operate as a controller. For example, it can be used to control the power delivered to an antenna 22 by an RF power amplifier 24 as shown in FIG. 6, in which case the final output voltage $V_{OUT}$ is used to control the gain of the power amplifier, the input voltage $V_{IN}$ is provided by a directional coupler 26 which samples the power from the amplifier, and a set-point signal is applied to the interpolator as the control signal $V_{CTRL}$. In this configuration, the feedback path is through the power amplifier and directional coupler. The system servoes until the power output from the amplifier corresponds to the value of the set-point signal. Again, the scaling relationship is linear-in-dB.

Figure 7:
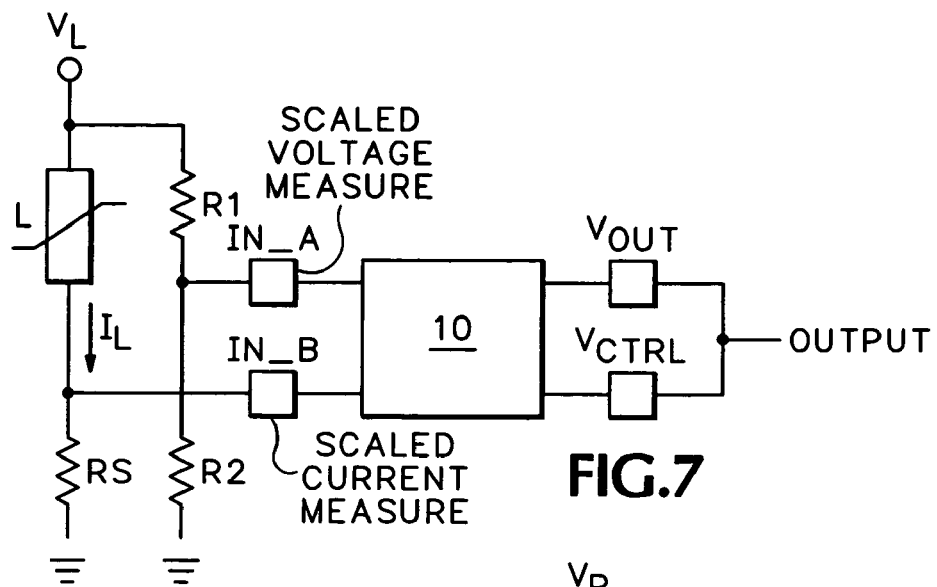
FIG. 7 is a simplified schematic showing how the system of FIG. 2 can be configured for operation in a measurement mode for measuring true power in a nonlinear load in accordance with the present invention.

In the embodiments described above, a single input signal $V_{IN}$ is applied equally to the first and second series of gain stages at input terminals IN_A and IN_B. This provides an accurate measure of the true power corresponding to the input signal $V_{IN}$, provided this voltage is measured across a linear load. However, by applying separate input signals to the first and second series of gain stages as shown in FIG. 7, the system of FIG. 2 can also be configured to measure the true power in a nonlinear load. Referring to FIG. 7, the voltage $V_L$ across a load L is divided down by a resistive attenuator R1,R2 and applied as the first input signal IN_A to the first series of gain stages. A current shunt RS is connected in series with the load and generates a voltage, which is proportional to the current $I_L$ through the load and used as the second input signal IN_B. In this configuration, the final output voltage $V_{OUT}$ is used as a feedback signal by coupling it back to the interpolator as the control signal $V_{CTRL}$, to implement the measurement function.

If the circuit of FIG. 2 is used for high frequency (RF) applications, the averaging circuit must accommodate two types of averaging: RF ripple filtering of the carrier signal, and long-term averaging of the modulation envelope. The averaged signal must also be compared to a setpoint. In the averaging circuit shown in FIG. 2, the comparison and averaging functions are performed directly at connection of the reference signal $I_{REF}$ and the averaging capacitor $C_{AVE}$. To prevent offset errors when used in the configurations shown in FIGS. 5-7, the averaging circuit should also accommodate an integration function to drive the error signal to zero. In the averaging circuit shown in FIG. 2, this is inherently performed in the averaging capacitor $C_{AVE}$, which integrates the error signal $I_{ERR}$. When the system has servoed to a particular input signal $V_{IN}$, $I_{OUT}=I_{REF}$ and $I_{ERR}=0$, at which point the voltage on the capacitor remains at a stable value.

Figure 3:
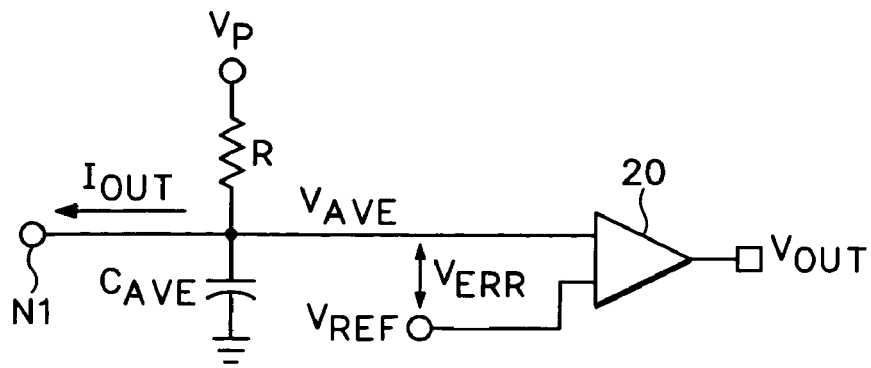
FIG. 3 is a schematic diagram of an alternative embodiment of an averaging circuit for the system of FIG. 2 in accordance with the present invention.

An alternative averaging circuit is shown in FIG. 3 where a resistor R is connected in parallel with the averaging capacitor $C_{AVE}$. Here, the averaging function is performed by resistor R and capacitor $C_{AVE}$. The comparison function is performed by the operational amplifier 20, which integrates the error signal $V_{ERR}$ which is the difference between the voltage $V_{AVE}$ across the capacitor and a reference voltage $V_{REF}$.

Figure 4:
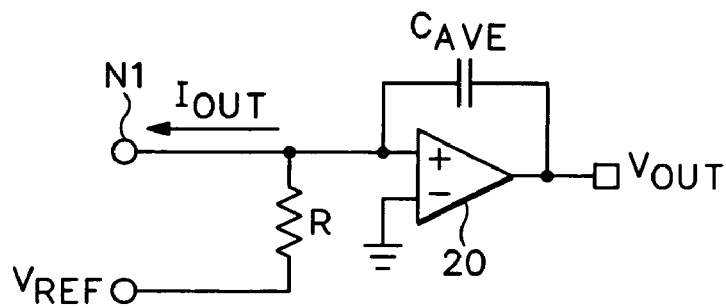
FIG. 4 is a schematic diagram of a second alternative embodiment of an averaging circuit for the system of FIG. 2 in accordance with the present invention.

Another alternative averaging circuit is shown in FIG. 4. In the circuit of FIG. 4, the capacitor $C_{AVE}$ is connected between the output terminal and noninverting input terminal of the operational amplifier 20. The noninverting input terminal of the op amp is also connected to node N1 and to $V_{REF}$ through a resistor R. The inverting input terminal of the op amp is grounded. For the averaging circuit of FIG. 4 to work properly in an RMS-DC converter for RF applications, the op amp would need to be a very wide band amplifier, otherwise, some RF ripple filtering would need to be performed before the signal is feed to the amplifier.

In a practical monolithic realization, the gain stages, multipliers, and summing circuits shown in FIG. 2 would preferably be implemented with fully differential inputs and outputs as described below.

Figure 8:
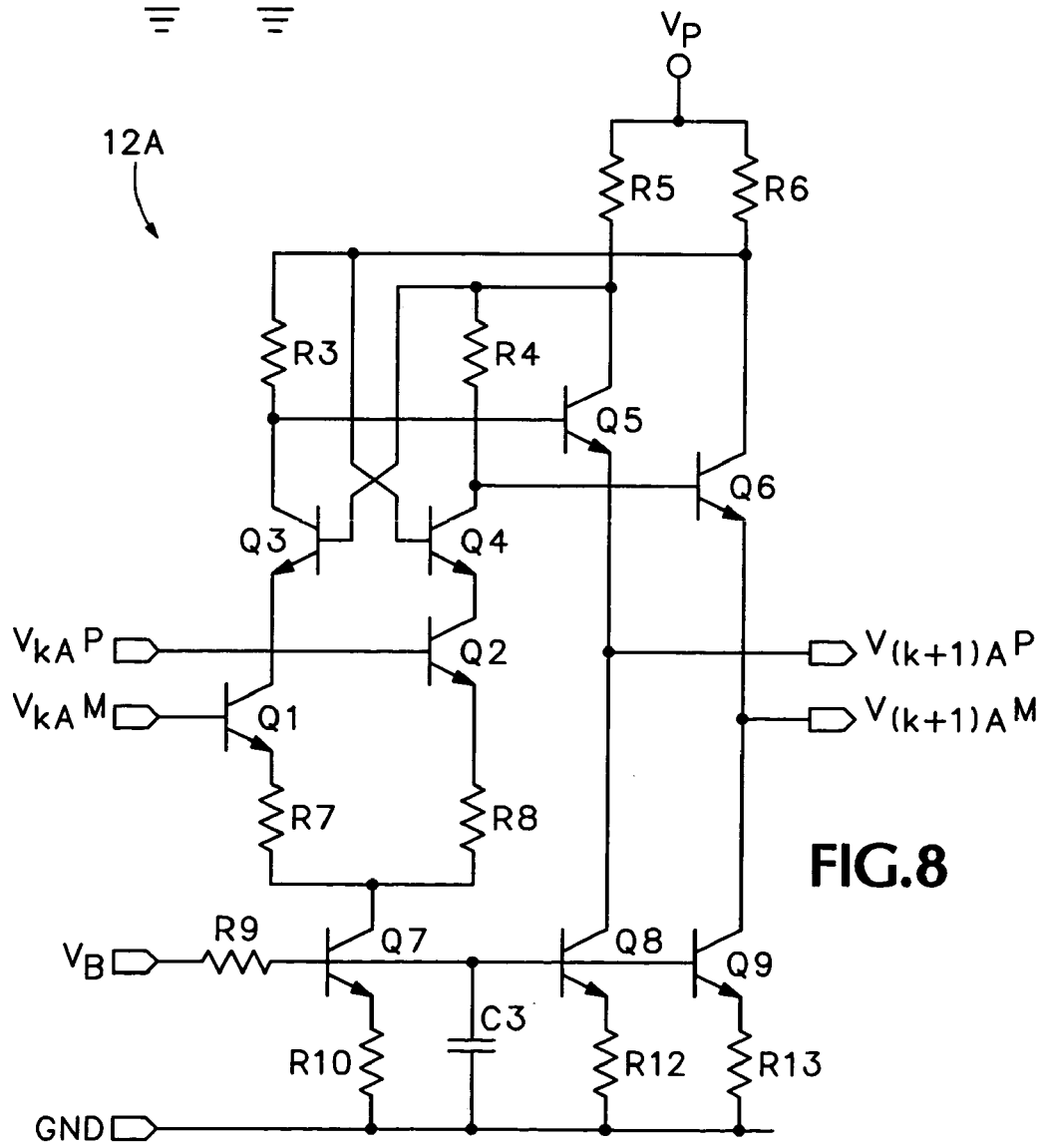
FIG. 8 is a schematic diagram of a preferred embodiment of a wideband amplifier cell in accordance with the present invention suitable for use in a practical implementation of the circuit of FIG. 2.

FIG. 8 is a schematic diagram of a preferred embodiment of an amplifier cell suitable for use in a practical implementation of the circuit of FIG. 2. The amplifier of FIG. 8 is based on the circuits disclosed in U.S. patent application Ser. No. 09/241,359 titled "Logarithmic Amplifier With Self-Compensating Gain For Frequency Range Extension" filed Jan. 29, 1999, which is now U.S. Pat. No. 6,144,244, by the same inventor as the present application, and which is herein incorporated by reference.

The circuit of FIG. 8 is shown configured as one of the "A" series of amplifiers 12A and includes an differential pair of transistors Q1 and Q2 which receive the input signal $V_{kA}P$ and $V_{kA}M$, which is a differential form of one of the signals $V_{kA}$ shown in FIG. 2. If the circuit of FIG. 8 was used for one of the "B" series of amplifiers, the inputs would be $V_{kB}P$ and $V_{kB}M$. The operation of a wideband amplifier such as that shown in FIG. 8 is described in detail in the above-referenced application Ser. No. 09/241,359, which is now U.S. Pat. No. 6,144,244, but will be briefly summarized here for convenience.

Transistors Q1 and Q2 are biased by a current source transistor Q7 in response to a bias voltage $V_B$. The outputs from Q1 and Q2 drive emitter-follower transistors Q5 and Q6 through transistors Q3 and Q4 which act mainly as cascodes. By cross-connecting the bases of Q3 and Q4 to a fraction of the total output voltage, the fraction determined by the ratios R6/(R3+R6) and (equally) R5/(R4+R5), the effect of parasitic capacitance at the collectors of Q3 and Q4 can be largely eliminated.

The differential output signal $V_{(k+1)A}P$, $V_{(k+1)A}M$ is provided at the emitters of emitter-follower transistors Q5 and Q6 which are biased by current source transistors Q8 and Q9 which are also driven by $V_B$. By sampling the load currents using R5 and R6, and also using positive feedback, the effect of the input capacitance of the following stage can be largely eliminated. The circuit of FIG. 8 provides about 10 dB of gain and is down –3 dB at about 3.1 GHz.

FIG. 9 shows the gain function of the wideband amplifier cell of FIG. 8. At low signal levels, the gain is linear and has a slope of "G". As the input signal level increases, the amplifier enters a limiting domain of operation at about ±E where the small signal gain approaches zero.

Figure 10:
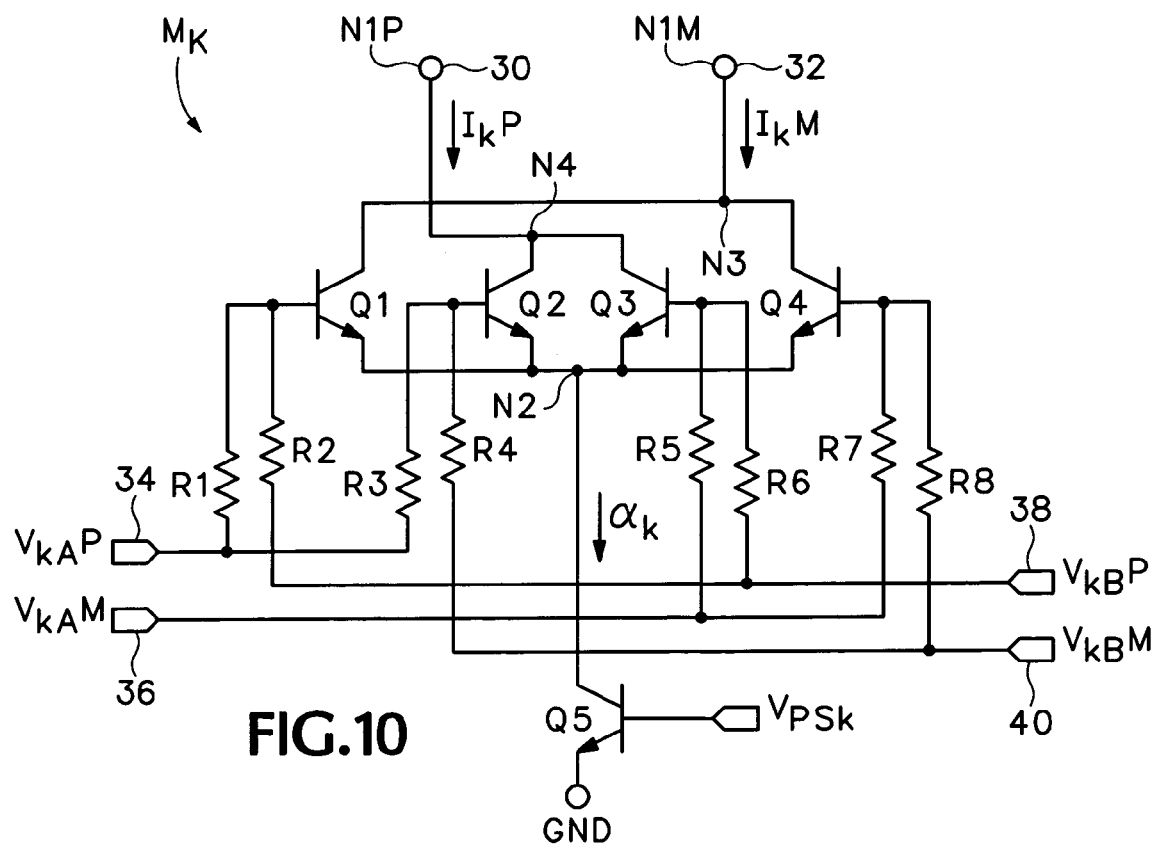
FIG. 10 is a schematic diagram of an embodiment of a four-quadrant multiplier in accordance with the present invention for use in a practical implementation of the circuit of FIG. 2.

FIG. 10 is a schematic diagram of an embodiment of a four-quadrant multiplier Mk for use in a practical implementation of the circuit of FIG. 2. The circuit of FIG. 10 includes a core of four transistors Q1-Q4 having their emitters connected together at a common node N2. A current source transistor Q5 sets up the weighting signal $\alpha_k$ in the form of a variable bias current (or "tail current") to transistors Q1-Q4 at node N2 in response to the control signal $V_{PSk}$ which is generated in the interpolator 18. The collectors of Q1 and Q4 are connected together at node N3 which is connected to output terminal 32, and the connectors of Q2 and Q3 are connected together at node N4 which is connected to output terminal 30.

The first "A" signal input terminal 34 is connected to the bases of Q1 and Q2 through resistors R1 and R3, respectively, while the second "A" input terminal 36 is connected to the bases of Q3 and Q4 through R5 and R7, respectively. Likewise, the first "B" signal input terminal 38 is connected to the bases of Q1 and Q3 through R2 and R6, respectively, while the second "B" input terminal 40 is connected to the bases of Q2 and Q4 through R4 and R8, respectively.

The first differential input signal $V_{kA}P, V_{kA}M$, is applied to terminals 34 and 36, respectively, and the second differential input signal $V_{kB}P, V_{kB}M$, is applied to terminals 38 and 40, respectively. The differential output signal $I_kP$-$I_kM$, which is generated at terminals 30 and 32, is the result of the multiplication of the first and second input signals. By varying the weighting current $\alpha_k$, which acts as the tail current for Q1-Q4, the transconductance of the entire multiplier is modulated so that the weighting signal acts as a third multiplying input that weights the output of the multiplier of FIG. 10 in proportion to the value of $\alpha_k$.

The multiplier of FIG. 10 has a linear input range at its "A" and "B" inputs of about ±40 mV, beyond which, the behavior starts to enter a limiting domain of operation. A major advantage of the multiplier of FIG. 10 is that both inputs have the same common mode voltage, and also, the DC response is symmetric with respect to both inputs. The use of Q5 as a current source allows scaling of the multiplication operation in response to the weighting signal. More importantly, the AC response is also identical with respect to both. However, any other type of variable current source can be used to achieve the third scaling input, or a fixed current source can be used if only a two-input multiplier with no scaling is required.

As discussed above, the interpolator 18 is preferably implemented as an interpolator having dual transistor ranks such as that described in co-pending U.S. patent application Ser. No. 09/466,050, filed Dec. 17, 1999 entitled "Interpolator Having Dual Transistor Ranks and Ratiometric Control" by the same inventor as the present application and which is incorporated by reference. If such an interpolator is used, then each transistor in the second rank of transistors in the interpolator also functions as the current source transistor Q5 in one of the multipliers of FIG. 10. The signal $V_{PSk}$ is then a partially switched voltage signal generated by forcing a partially switched current $I_{PSk}$ from the first rank of transistors through a resistor connected to the base of Q5.

Figure 11:
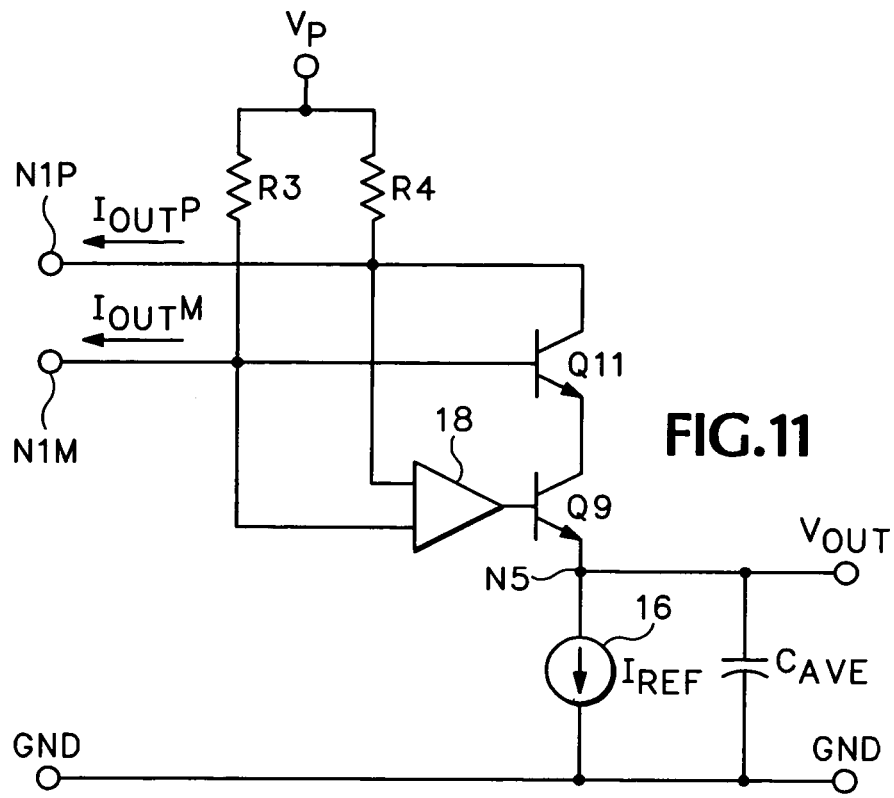
FIG. 11 is a simplified schematic diagram of an embodiment of an averaging circuit in accordance with the present invention for a practical implementation of the circuit of FIG. 2.

FIG. 11 is a simplified schematic diagram of an embodiment of an averaging circuit in accordance with the present invention for use in a practical realization of the circuit of FIG. 2. The circuit of FIG. 11 generates the final output voltage $V_{OUT}$ in response to the differential input signal $I_{OUT}P, I_{OUT}M$ which is a differential version of the output signal $I_{OUT}$ of FIG. 2 obtained by separately summing the output signals $I_kP$ and $I_kM$ from the multipliers of FIG. 9.

Referring again to FIG. 11, resistors R3 and R4 provide a load for the currents $I_{OUT}P$ and $I_{OUT}M$. The op amp 20 forces Q9 to absorb the difference between $I_{OUT}P$ and $I_{OUT}M$. The emitter current of Q9, which is a single-ended replica of the differential input current, is summed at node N5 with the current $I_{REF}$ from current source 16. Capacitor $C_{AVE}$, which is also connected to node N5, integrates the error signal which is the difference between $I_{REF}$ and the current through Q9. The voltage across $C_{AVE}$ is then the final output voltage $V_{OUT}$, which is used to control the interpolator in the measurement mode.

Figure 12:
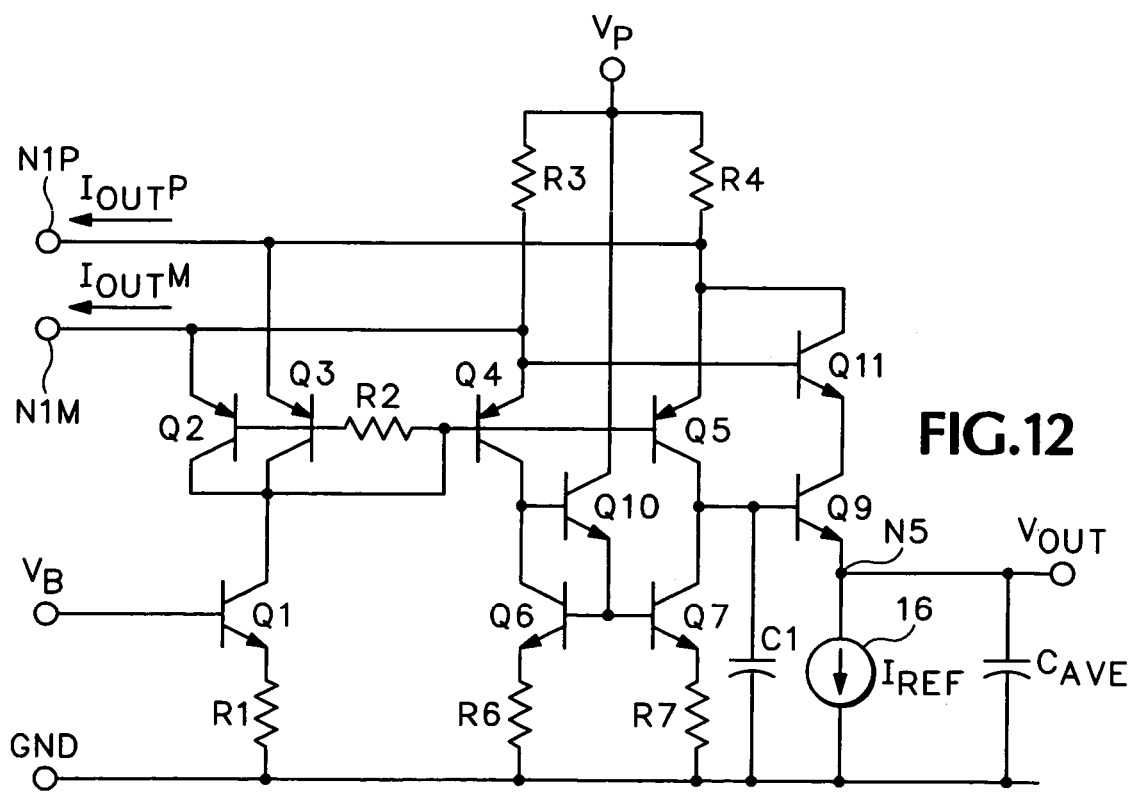
FIG. 12 is a schematic diagram showing more details of a practical embodiment of the averaging circuit of FIG. 11.

FIG. 12 is a schematic diagram showing more details of a practical embodiment of the averaging circuit of FIG. 11. Referring to FIG. 12, resistors R3 and R4 provide a load for the currents $I_{OUT}P$ and $I_{OUT}M$, and also provide bias current for cascode transistors Q4 and Q5. Current source transistor Q1 establishes currents in Q2 and Q3, which in turn, establish an anchor voltage at the bases of Q4 and Q5 through beta compensation resistor R2. The currents in Q4 and Q5 are thus replicas of the currents through Q2 and Q3. By scaling the area ratios between Q2,Q3 and Q4,Q5 the current through Q1 can be used to set the quiescent current through Q4 and Q5 in the absence of any differential between the input currents $I_{OUT}P$, $I_{OUT}M$. Any difference between $I_{OUT}P$ and $I_{OUT}M$ appears as a difference between the collector currents through Q4 and Q5. Therefore, the quiescent current must be large enough to accommodate the largest expected difference between $I_{OUT}P$ and $I_{OUT}M$.

Transistors Q6 and Q7 form a current mirror which is optionally degenerated by resistors R6 and R7. Transistor Q10 provides beta compensation to the current mirror in a conventional manner. Transistors Q9 and Q11 maintain the current mirror in a balanced state because any difference between the currents $I_{OUT}P$ and $I_{OUT}M$ causes capacitor C1 to charge or discharge through Q5 or the mirror which alters the current in Q9 and Q11. For the current in the mirror to remain balanced, Q9 must absorb the difference, and the result is a current through Q9 and Q1 which is proportional to the difference between $I_{OUT}P$ and $I_{OUT}M$.

The circuit of FIG. 12 converts the differential input current, which exists at a voltage level close to the positive power supply rail $V_P$, to a single ended current through Q9 which can swing very close to the ground rail GND. The current source 16 should also be able to source the reference current $I_{REF}$ at a voltage all the way down near GND. An embodiment of the current source 16 is described below with respect to FIGS. 14 and 15. This allows the output voltage $V_{OUT}$ to swing close to GND which makes it easy to use $V_{OUT}$ as the feedback voltage $V_{CTRL}$ for driving the interpolator when the system is configured as a controller.

Figure 18:
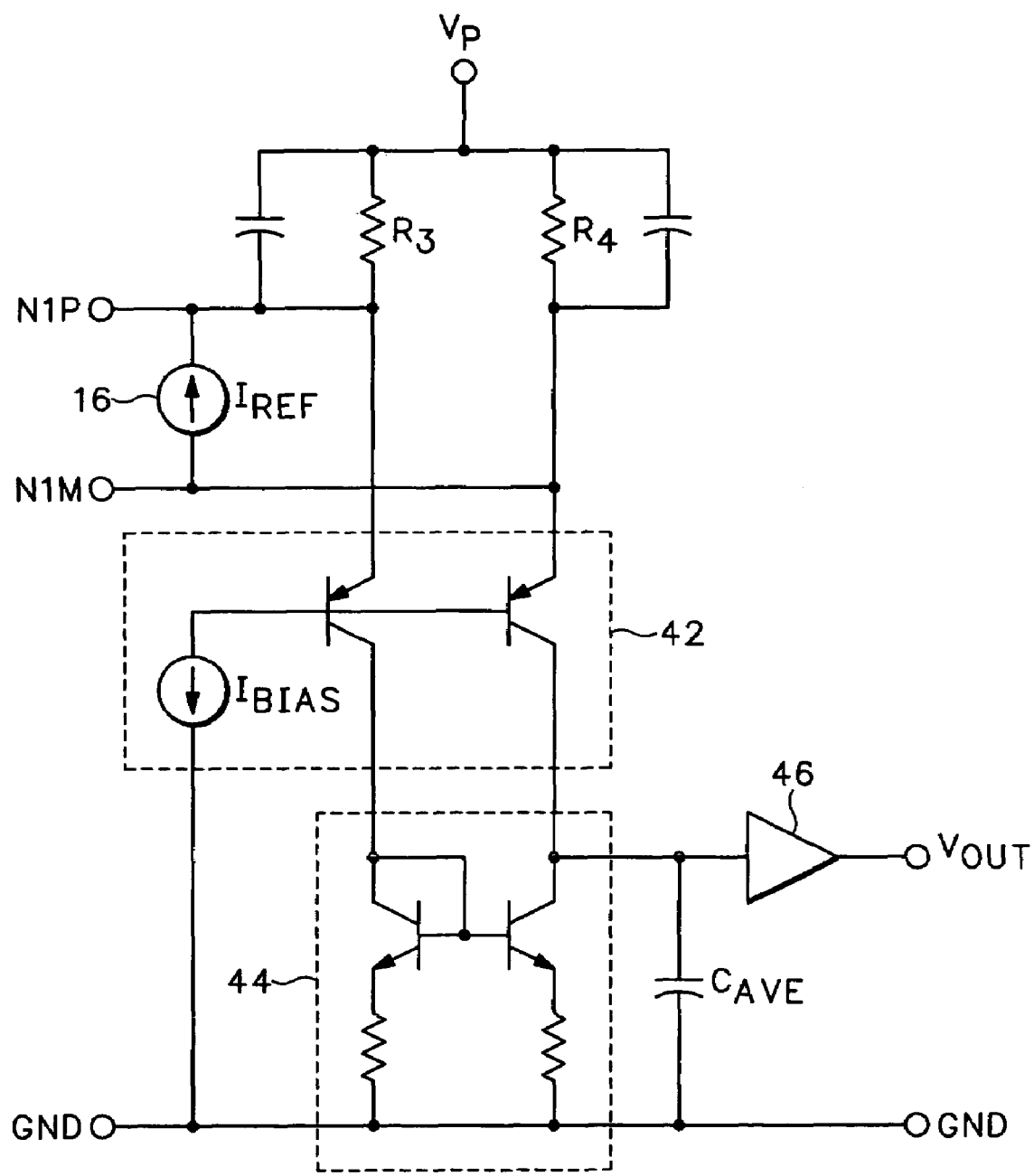
FIG. 18 is a schematic diagram showing a preferred embodiment of an averaging circuit for a practical implementation of an RMS-DC converter in accordance with the present invention.

FIG. 18 is a simplified schematic diagram showing a preferred embodiment of an averaging circuit for a practical implementation of the system of FIG. 2. Referring to FIG. 18, the averaging circuit includes load resistors R3 and R4 which convert the currents $I_{OUT}P$ and $I_{OUT}M$ to voltage signals which are input to an op amp 42 having differential current outputs connected to a current mirror 44. The capacitors across R3 and R4 perform high frequency ripple filtering. The op amp 42, which can be a simple gm cell, senses the voltage difference between the nodes N1P and N1M. Any imbalance in the voltage between the nodes causes an imbalance in the current outputs of the gm cell. Since the current mirror 44 maintains equal currents in both sides, the differential output current from the op amp charges or discharges the filter capacitor $C_{AVE}$. The output signal $V_{OUT}$, which is preferably buffered by buffer amplifier 46, is generated across $C_{AVE}$. The reference current $I_{REF}$ is provided by current source 16 which is connected across the nodes N1P and N1M.

An advantage of the circuit of FIG. 18 is that it charges and discharges the capacitor $C_{AVE}$ at the same slew rate. This is in contrast to the circuit of FIG. 12 in which the capacitor is charged quickly by Q9, but only discharges at a rate established by the current $I_{REF}$.

Figure 13:
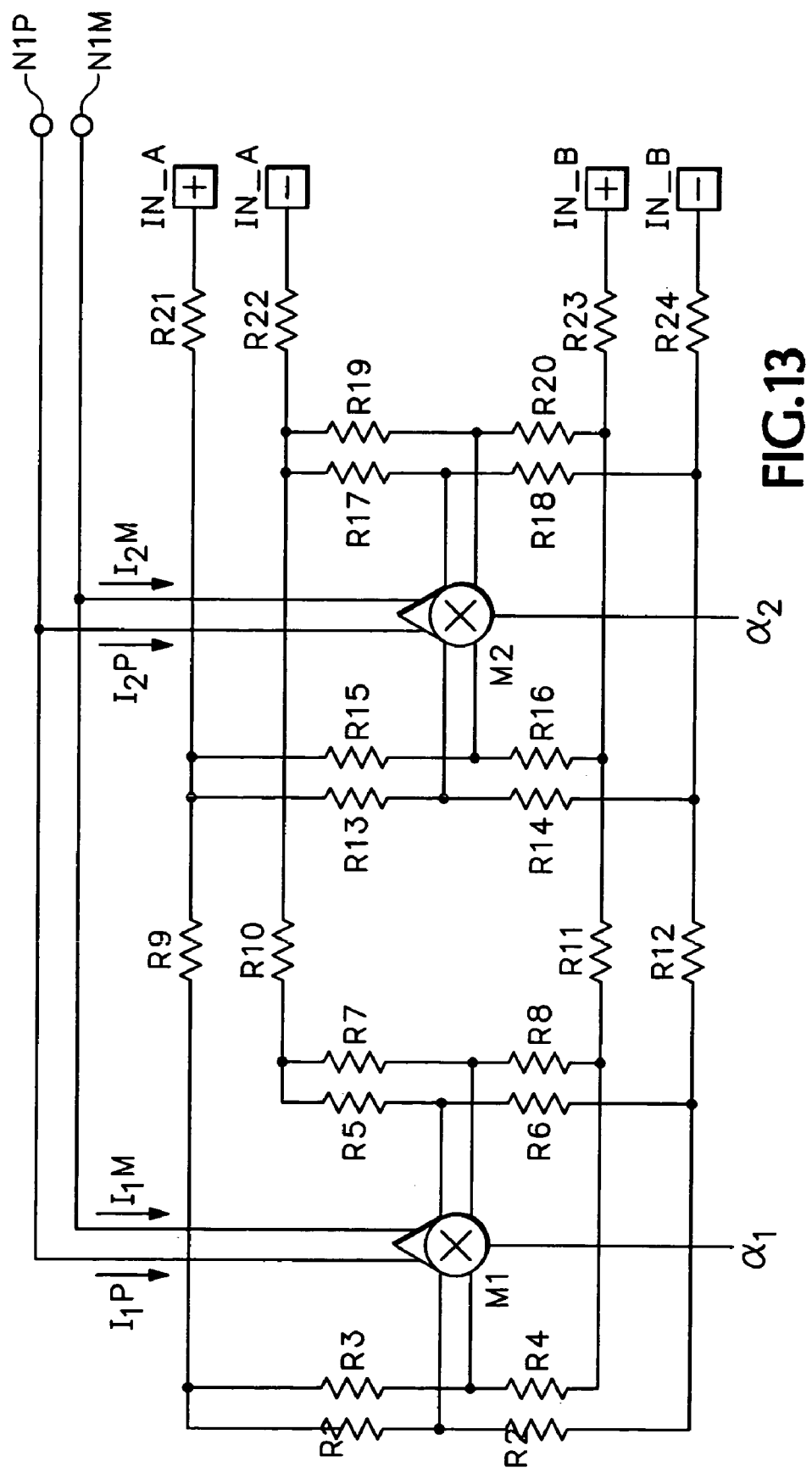
FIG. 13 shows a preferred arrangement of differential attenuators and multipliers in accordance with the present invention for a practical implementation of the circuit of FIG. 2.

FIG. 13 shows a preferred arrangement of differential attenuators and multipliers at the low numbered end of a practical embodiment of the backbone of the system of FIG. 2. As is apparent from FIG. 13, the input resistors to the multiplier cells also function as part of the attenuator network. Therefore, the multipliers M1 and M2 shown in FIG. 13 only include the core of four transistors Q1-Q4 shown in FIG. 10.

In a practical embodiment of the system of FIG. 2, a dynamic range of over 100 dB can be achieved using four pairs of attenuating gains stages and six pairs of amplifying gain stages, each having 10 dB of attenuation or gain. The values of the components should be chosen so that when the output current $I_{OUT}$ is equal to the reference current $I_{REF}$, the multiplier or multipliers which are enabled by bias currents from the interpolator are operating in the accurate portion of their operating range. That is, they have not reached an output limiting range (as occurs in a logarithmic amplifier) but instead are acting essentially as true squaring cells.

Figure 14:
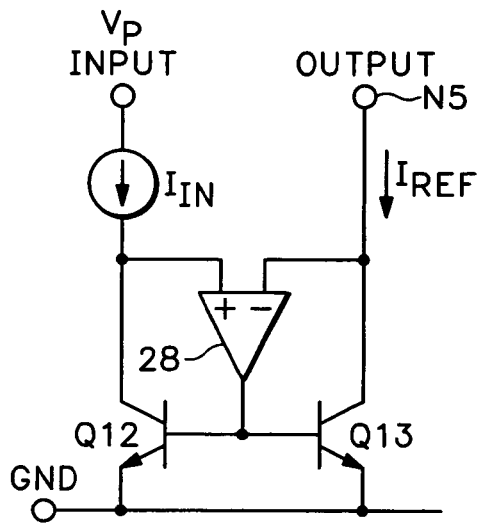
FIG. 14 is a simplified schematic diagram of an embodiment of a current source in accordance with the present invention suitable for use in the averaging circuit of FIGS. 11 and 12.

FIG. 14 is a simplified schematic of a current mirror suitable for use as the current source 16 in FIGS. 11 and 12, and the current mirror 44 of FIG. 18, and for other applications as well. Referring to FIG. 14, transistors Q12 and Q13 are configured much like in a basic current mirror. However, rather than connecting the collector of Q12 back to its base, the collectors of Q12 and Q13 are connected to the noninverting and inverting inputs, respectively, of an op amp 28. The output of op amp 28 drives the bases of Q12 and Q13 and forces their collector voltages to track so that Q12 and Q13 both operate at the same collector voltage. Thus, the output current $I_{REF}$ into the collector of Q13 precisely replicates the input current $I_{IN}$ into the collector of Q12, even when the collector of Q13 swings all the way down to within a few millivolts of ground.

Figure 16:
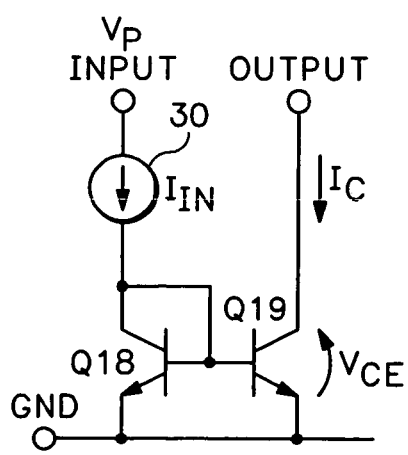
FIG. 16 is a schematic diagram of a conventional current mirror.
Figure 17:
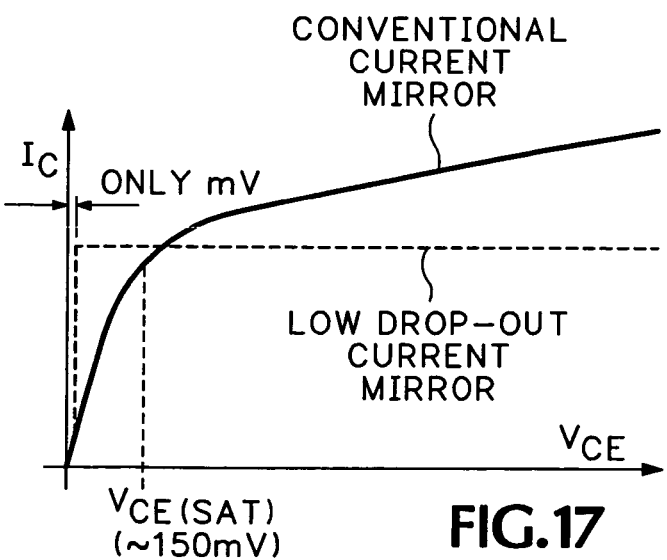
FIG. 17 illustrates the output characteristics of the current mirror of FIG. 16.

The benefits of the circuit of FIG. 14 can be better understood by considering the conventional current mirror Q18,Q19 shown in FIG. 16, and the output characteristic of transistor Q19 shown in FIG. 17. In the circuit of FIG. 16, the bases of Q18 and Q19 always operate at about a $V_{BE}$ (~800 mV) above GND. When the collector of Q19 is greater than a $V_{BE}$ above GND, the current through the collector of Q19 tracks the current through the collector of Q18 reasonably well. However, when the collector voltage of Q19 drops below $V_{CE(SAT)}$, the base-collector junction of Q19 begins to saturate, thereby causing a very large error between the collector currents of Q18 and Q19. Saturation of Q19 also causes base current to be diverted from Q18 through the base-collector junction of Q19.

The circuit of FIG. 14, however, eliminates this problem by maintaining the collectors of Q12 and Q13 at the same voltage, all the way down to a within few millivolts of GND. Even though Q12 and Q13 are deeply in saturation when their collectors are much lower than $V_{CE(SAT)}$, all of the base current to Q12 and Q13 is provided by the op amp, so none of the base current required by Q12 is lost in the coupling to Q13.

A further advantage of the circuit of FIG. 14 is that, because Q12 and Q13 operate at the same collector voltage, the output impedance is infinite. An additional benefit is that the input offset voltage of the op amp 28 can be relatively high because a few millivolts of offset between the collectors of Q12 and Q13 do not have much effect on the operation of the circuit. Therefore, a simple inexpensive op amp can be utilized.

Figure 15:
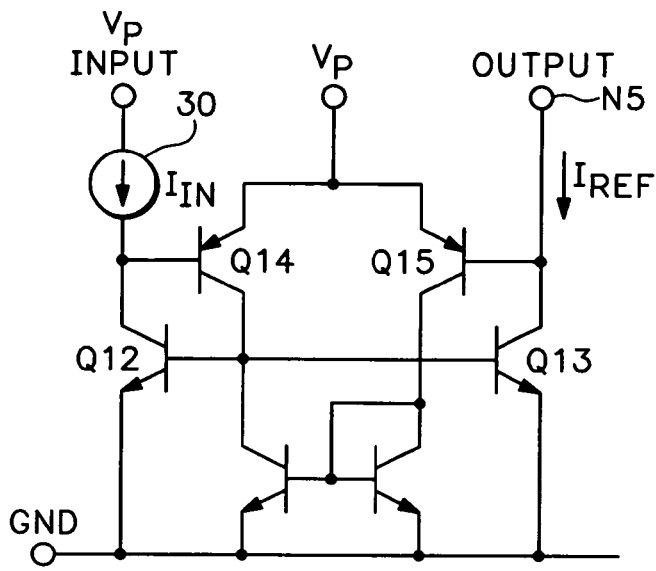
FIG. 15 is a schematic diagram showing more details of a practical embodiment of the current source of FIG. 14 in accordance with the present invention.

FIG. 15 is a schematic diagram showing more details of a practical embodiment of the current source of FIG. 14 in accordance with the present invention. In the circuit of FIG. 15, the op amp 28 is realized as a differential pair of PNP transistors Q14 and Q15 which are loaded by a current mirror formed by NPN transistors Q16 and Q17. Since the collectors of Q12 and Q13 are equal, the base currents in Q14 and Q15 are also equal, so there is no error due to base currents. Also, since the collectors of Q12 and Q13 are equal, the input current source 30 must have enough compliance to accommodate the expected voltage swing at the output node N5.

Figure 19:
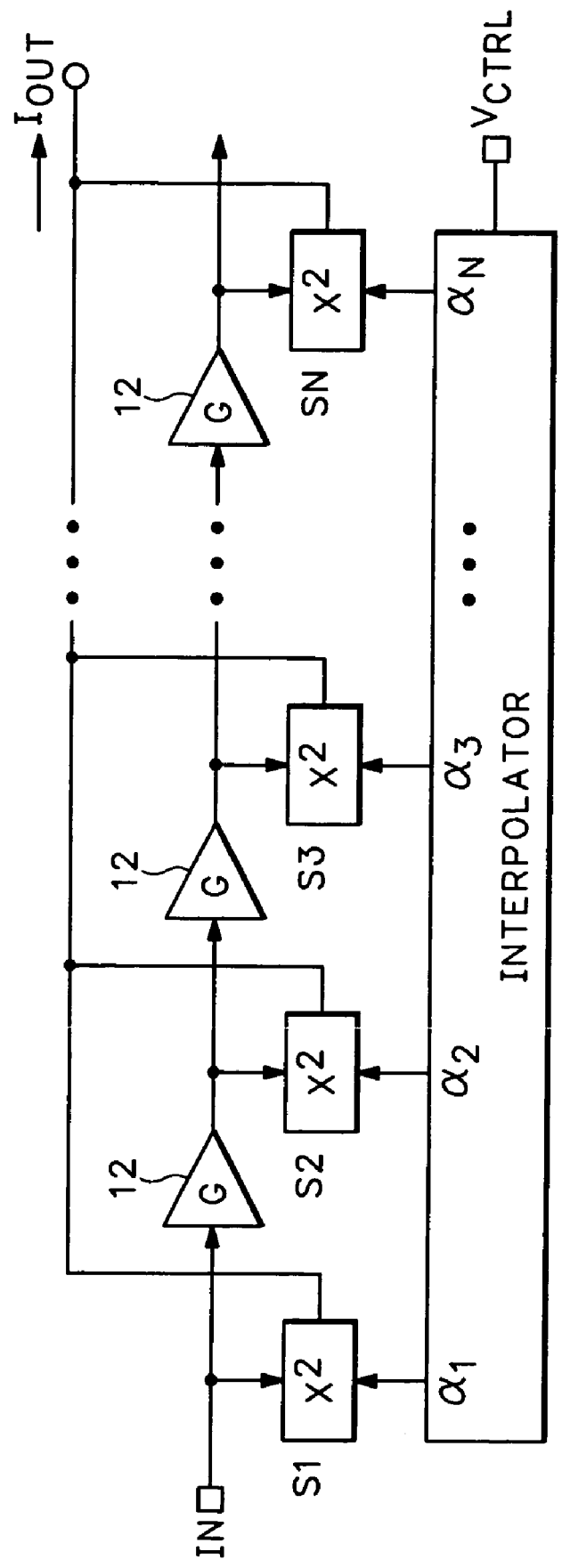
FIG. 19 is a simplified schematic of an embodiment of an RMS-DC converter, which utilizes a single series of gain stages in accordance with the present invention.

Many of the advantages of the present invention can still be realized even with a single series of gain stages as shown in FIG. 19. The system of FIG. 19 is in many respects similar to those of FIGS. 1 and 2, but it only utilizes a single series of gain stages to generate a single series of amplified signals which are individually squared and weighted, and then summed to generate an output signal. The squaring and weighting functions could be performed individually using a series of squaring/weighting stages, each having a squaring cell with a fixed scale factor and a multiplier for weighting the output from the squaring cell by multiplying it with a weighting signal. In a preferred embodiment, however, each squaring/weighting stage includes a single squaring cell (S1, S2, . . . SN) that can simultaneously square and weight the signal from the gain stage responsive to a weighting signal as shown in FIG. 19.

The summed output signal $I_{OUT}$ from the system of FIG. 19 is averaged and utilized in the same manner as that in FIGS. 1 and 2. As with the systems of FIGS. 1 and 2, the system of FIG. 19 can be implemented with any number of gain stages, and some of the lower numbered gain stages can be attenuators rather than amplifiers. The system of FIG. 19 provides wide dynamic range power measurement at high operating frequencies, albeit without the benefit of uncorrelated noise cancellation obtained with a dual series of gain stages.

Figure 20:
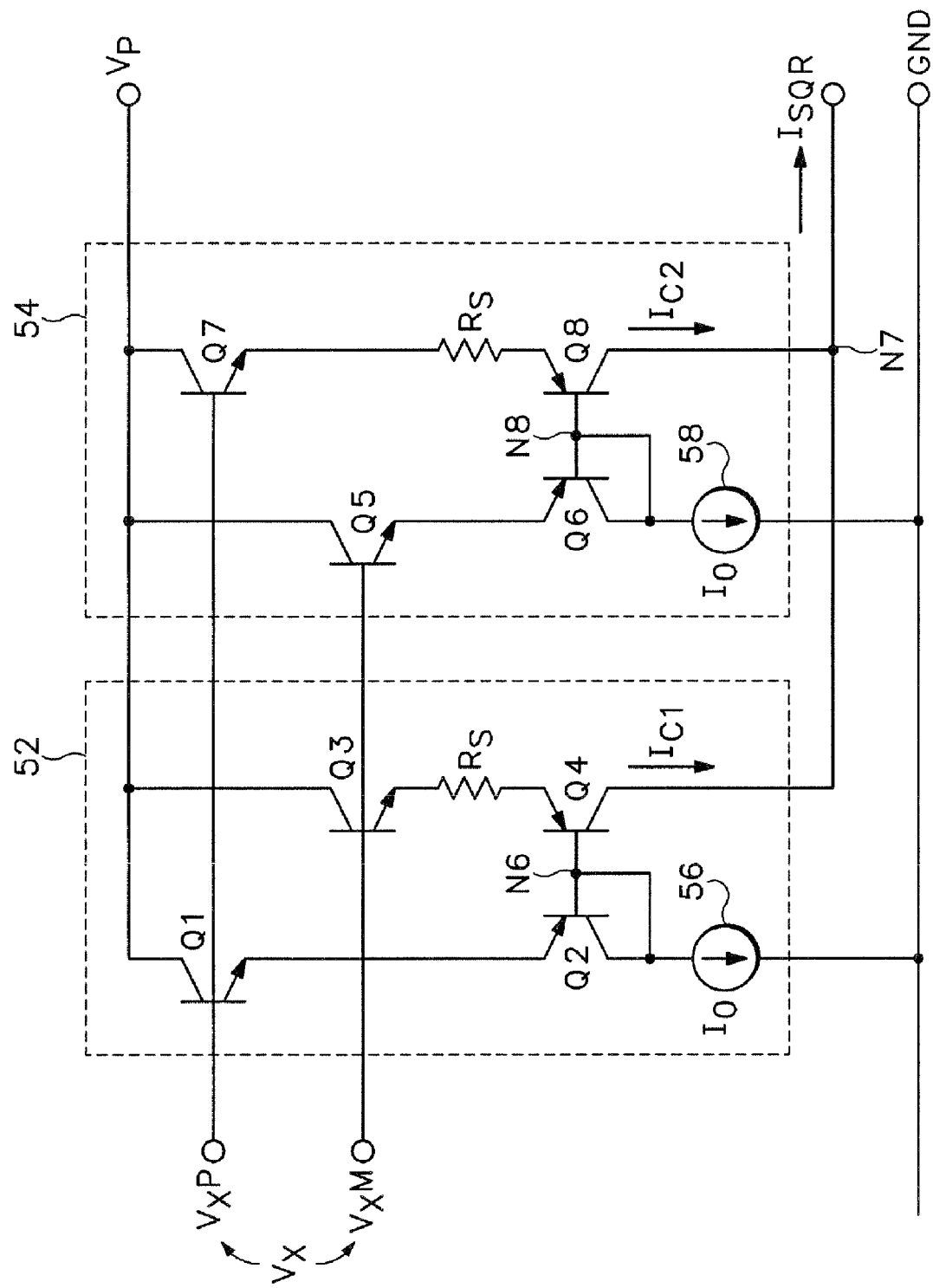
FIG. 20 is a schematic diagram of an embodiment of a squaring cell in accordance with the present invention.

FIG. 20 shows an embodiment of a squaring cell in accordance with the present invention suitable for use as one of the squaring cells S1, S2, . . . SN of FIG. 19. The squaring cell of FIG. 20 includes two exponential current generators 52 and 54, which generate output currents $I_{C1}$ and $I_{C2}$ that vary exponentially in response to the differential input voltage Vx which is the difference between the separate signals VxP and VxM. The first exponential current generator 52 includes a first emitter follower transistor Q1 which receives the signal VxP at its base and has its emitter connected to the emitter of Q2 which is diode-connected. A current source 56 is connected to the collector and base of Q2 at node N6. A second emitter follower transistor Q3 receives the signal VxM at its base and has its emitter connected to the emitter of Q4 through an optional resistor $R_S$. The base of Q4 is connected to the base of Q2, and the collector of Q4 is connected to a summing node N7.

The current source 56 maintains a constant current $I_0$ through Q1 and Q2, thereby establishing a certain voltage across the series-connected base-emitter junctions of Q1 and Q2. Assuming Q1-Q4 have equal emitter areas, and neglecting the effect of $R_S$ for now, the current through Q3 and Q4 is:

$$I_{C1} = I_0 \exp\left(\frac{-Vx}{2V_T}\right) \quad \text{(Eq. 16)}$$

The construction and operation of the second exponential current generator 54 is similar to that of generator 52, except that the bases of the emitter follower transistors Q5 and Q7 are connected to receive the opposite signals, so the current through Q7 and Q8 is:

$$I_{c2} = I_0 \exp\left(\frac{Vx}{2V_T}\right) \quad \text{(Eq. 17)}$$

The currents $I_{C1}$ and $I_{C2}$ are summed at node N7 to produce a final output current $I_{SQR}$ which closely approximates the squared value of the input signal Vx. When the input signal Vx is zero, $I_{SQR}$ has a quiescent offset value of $2I_0$. As the input signal increases in either direction, one of the exponential functions dominates, and $I_{SQR}$ increases accordingly in the positive direction.

The square law approximation can be better understood by using Taylor series expansions for the exponential functions. First, the final output current $I_{SQR}$ is:

$$I_{SQR} = I_0\left[\exp\left(\frac{Vx}{2V_T}\right) + \exp\left(\frac{-Vx}{2V_T}\right)\right] \quad \text{(Eq. 18)}$$

The expansions for the general exponential functions $e^x$ and $e^{-x}$ are:

$$e^x = 1 + x + \frac{x^2}{2!} + \frac{x^3}{3!} + \frac{x^4}{4!} \ldots \quad \text{(Eq. 19)}$$

and $$e^{-x} = 1 - x + \frac{x^2}{2!} - \frac{x^3}{3!} + \frac{x^4}{4!} \ldots \quad \text{(Eq. 20)}$$

thus $$e^x + e^{-x} = 2 + x^2 + \frac{x^4}{12} \ldots \quad \text{(Eq. 21)}$$

Using the expansion of Eq. 21 with Eq. 18 yields:

$$I_{SQR} = I_0\left[2 + \left(\frac{Vx}{2V_T}\right)^2 + \frac{1}{12}\left(\frac{Vx}{2V_T}\right)^4 \ldots \right] \quad \text{(Eq. 22)}$$

which shows that the form of the final output current $I_{SQR}$ is dominated by the square term.

The squaring cell of FIG. 20 can be optimized for a particular application by including the resistors $R_S$ which alter the currents $I_{C1}$ and $I_{C2}$ so as to soften the shape of the exponential functions, thereby providing a better approximation to a true square law behavior over a certain range of Vx. The inclusion of the resistors $R_S$ diminishes the effect of the higher-order terms in the series expansion of Eq. 22.

When $R_S > 0$, the outputs from the exponential current generators are not truly exponential, but instead, are less than that which would be generated by an exact exponential behavior. As used herein, the term exponential current generator refers not only to a circuit that generates a true exponential current, but also to a circuit that generates a "sub-exponential" function, that is, an output current which follows a nonlinear law which may be deliberately "softened", either by choice of transistor types or geometry, or by choice of bias currents, or by the inclusion of degeneration resistors $R_S$ so as to result in an output that deviates from an ideal exponential function, as for example, for the purpose of more closely approximating an ideal square law when used for a squaring cell, or an ideal multiplicative law when used for a multiplier circuit as described below. Likewise, as used herein the term exponential current or signal refers not only to a true exponential current or signal, but also to an altered exponential current or signal. It should also be understood that the term exponential current generator also refers to any exponential function generator (e.g., voltage rather than current) that can generate exponential or sub-exponential functions which can be used to synthesize a squaring cell or multiplier.

To compensate for temperature variations, the currents $I_0$ should preferably be made proportional to absolute temperature (PTAT), and Vx is preferably arranged to also be PTAT—for example, as the output of a basic BJT gain stage.

An advantage of the circuit of FIG. 20 is that it can accommodate larger input voltage swings than other types of squaring circuits while still maintaining adequate square-law behavior. The peak output current $I_{C1}$ in the circuit of FIG. 20 is not limited by the value of a bias current source as it is in the squaring cell disclosed in U.S. patent application Ser. No. 09/245,051 filed Feb. 4, 1999, which is now U.S. Pat. No. 6,204,719. Also, when the input signal and output current $I_{C1}$ of the circuit of FIG. 20 become very large, the output current $I_{C1}$ can still behave according to an approximately exponential function, and the sum of two exponentials can provide a better approximation to a square law than the more-nearly linear behavior encountered with large signals in the squaring cell disclosed in U.S. patent application Ser. No. 09/256,640 filed Feb. 24, 1999, which is now U.S. Pat. No. 6,172,549. A further advantage of the circuit of FIG. 20 is that it can operate on a power supply voltage of 2 volts minimum for typical silicon transistors.

Many variations of the circuit of FIG. 20 are contemplated by the present invention. For example, in FIG. 20, the currents $I_{C1}$ and $I_{C2}$ are taken from the collectors of Q4 and Q8, and the collectors of Q3 and Q7 are shown connected to the power supply rail $V_P$. Alternatively, the currents $I_{C1}$ and $I_{C2}$ could be taken from the collectors of Q3 and Q7, in which case, the collectors of Q4 and Q8 would be connected to GND. Although transistors Q1, Q3, Q5, and Q7 are shown as NPN devices and Q2, Q4, Q6 and Q8 are shown as PNP devices, other polarities and device types, including CMOS transistors, can be utilized. Also, the squaring cell of FIG. 20 is suitable not only for use as one of the squaring cells S1, S2, . . . SN of FIG. 19, but for other applications as well.

Transistors Q1 and Q2, along with current source 56, in FIG. 20 form what can be referred to as a "constant current stack" because current source 56 maintains a constant current (or a PTAT current as discussed above, or a quasi-constant current as discussed below) through Q1 and Q2. Transistors Q3 and Q4 (and optionally $R_S$) form what can be referred to as a variable current stack because the current $I_{C1}$ varies in response to Vx. Different numbers of these stacks can be combined in accordance with the present invention to create additional useful circuits such as the four-quadrant multiplier described below with reference to FIG. 21.

If the currents $I_0$ from sources 56 and 58 in FIG. 20 are maintained at a constant level, the squaring cell will have a fixed scaling factor. However, if the currents $I_0$ are made to vary in response to a control signal, such as one of the weighting signals $\alpha_k$ of FIG. 19, then the scale factor of the squaring cell will vary in response to the weighting signal, and the squaring and weighting functions can be performed simultaneously. In this case, the constant current $I_0$ can be referred to as a quasi-constant current, that is, even though the current can be varied, the variation is generally independent of the input signal Vx. As used herein, the term constant current refers to both a constant current and a quasi-constant current.

Figure 21:
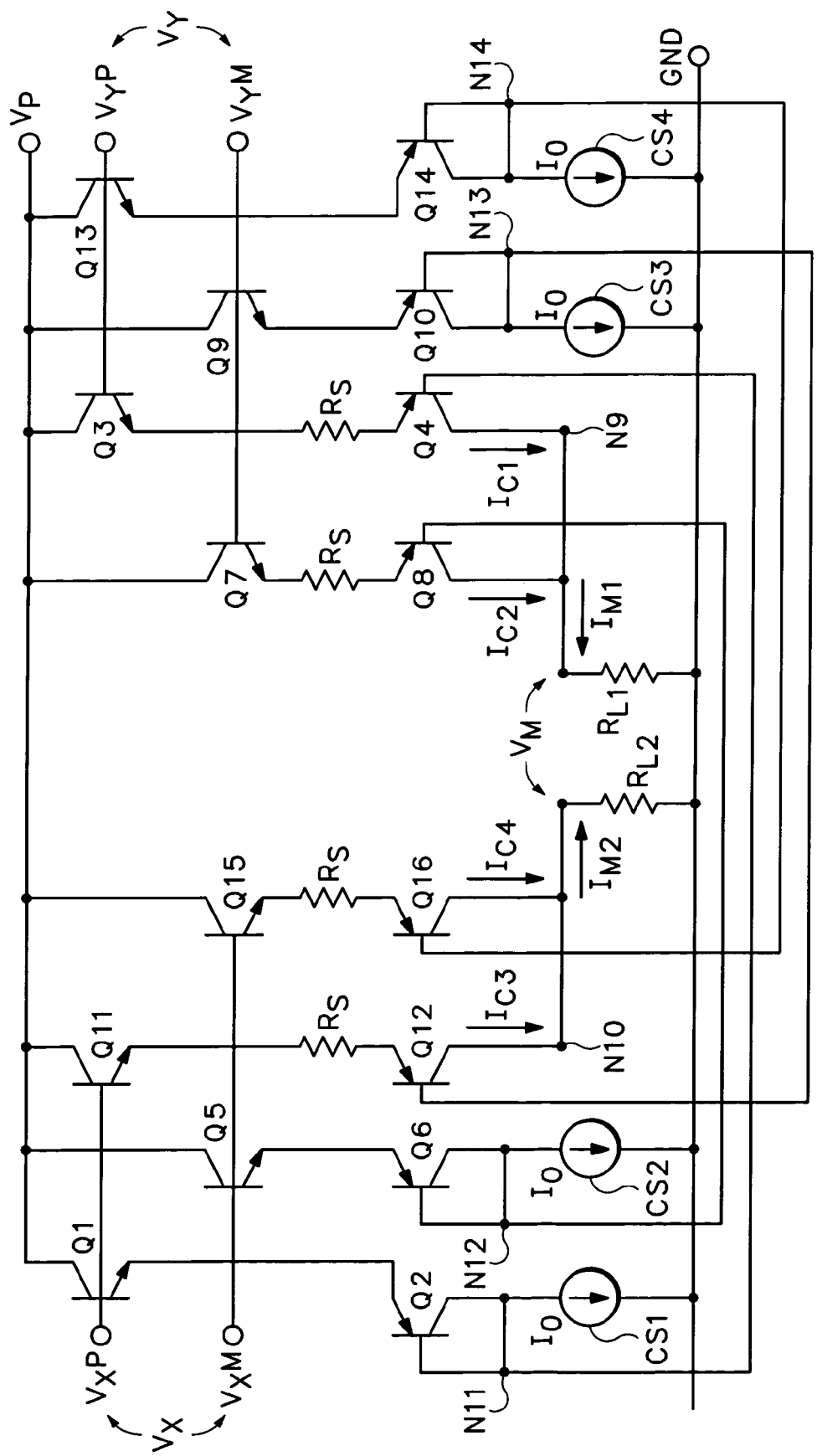
FIG. 21 is a schematic diagram of an embodiment of a four-quadrant multiplier in accordance with the present invention.

FIG. 21 is a schematic diagram of an embodiment of a four-quadrant multiplier in accordance with the present invention. The multiplier of FIG. 21 is suitable for use as one of the multipliers Mk in a practical implementation of the circuit of FIG. 2, as well as for numerous other applications.

The multiplier of FIG. 21 includes four exponential current generators, each having a constant current stack and a variable current stack similar to those in the squaring cell described above with reference to FIG. 20. However, the stacks in the multiplier circuit of FIG. 21 are cross-connected so as to generate two output currents $I_{M1}$ and $I_{M2}$, the difference of which represents the four-quadrant multiplication of the input signals Vx and Vy.

The first exponential current generator generates the current $I_{C1}$ and includes a constant current stack (Q1, Q2, CS1) driven by VxP and a variable current stack (Q3, Q4) driven by VyP. The second exponential current generator generates the current $I_{C2}$ and includes a constant current stack (Q5, Q6, CS2) driven by VxM and a variable current stack (Q7, Q8) driven by VyM. The third exponential current generator generates the current $I_{C3}$ and includes a constant current stack (Q9, Q10, CS3) driven by VyM and a variable current stack (Q11, Q12) driven by VxP. The fourth exponential current generator generates the current $I_{C4}$ and includes a constant current stack (Q13, Q14, CS4) driven by VyP and a variable current stack (Q15, Q16) driven by VxM. The currents $I_{C1}$ and $I_{C2}$ are summed at node N9 to generate $I_{M1}$, while the currents $I_{C3}$ and $I_{C4}$ are summed at node N10 to generate $I_{M2}$. The currents $I_{M1}$ and $I_{M2}$ are converted to voltages by resistors $R_{L1}$ and $R_{L2}$ to generate the final output voltage $V_M$.

As with the squaring cell of FIG. 20, multiplying behavior of the multiplier of FIG. 21 can be better understood by using Taylor series expansions for the exponential functions. Taking the final output signal as a current $I_M$, which is the difference between the currents $I_{M1}$ and $I_{M2}$, and using x to denote $Vx/2V_T$ and y to denote $Vy/2V_T$, the final output current $I_M$ is:

$$I_M = I_0[\exp(x+y) + \exp(-x-y) - \exp(x-y) - \exp(y-x)] \quad \text{(Eq. 23)}$$

$$= I_0(e^x - e^{-x})(e^y - e^{-y}) \quad \text{(Eq. 24)}$$

Using the expansions for $(e^x - e^{-x})$ and $(e^y - e^{-y})$ yields:

$$I_M = I_0\left[2x + \frac{x^3}{3} + \ldots\right]\left[2y + \frac{y^3}{3} + \ldots\right] \quad \text{(Eq. 25)}$$

$$= I_0\left[4xy + \frac{2}{3}(xy^3 + yx^3) + \ldots\right] \quad \text{(Eq. 26)}$$

The cubic terms are unimportant provided x and/or y are less than 1 (which requires Vx and/or Vy to be less than $2V_T$, that is, less than about 52 mV at T=27° C.), so the final output current is dominated by the "xy" term. If the resistors $R_S$ are included, the exponential functions are modified so as to soften the response to large values of Vx and Vy, while not seriously degrading the accuracy for more moderate values.

As with the squaring cell of FIG. 20, the curve-shaping resistors $R_S$ in the multiplier of FIG. 21 are optional, and the currents $I_{C1}$ through $I_{C4}$ can be obtained from either end of the variable current stacks. If no gain scaling is used, $I_0$ should preferably be made PTAT to compensate for temperature variations. Also, the current sources can be designed to vary $I_0$ in response to a weighting signal $\alpha_k$ so the multiplying and weighting functions can be performed simultaneously when the multiplier of FIG. 21 is used as one of the multipliers Mk in the circuit of FIG. 2.

Figure 22:
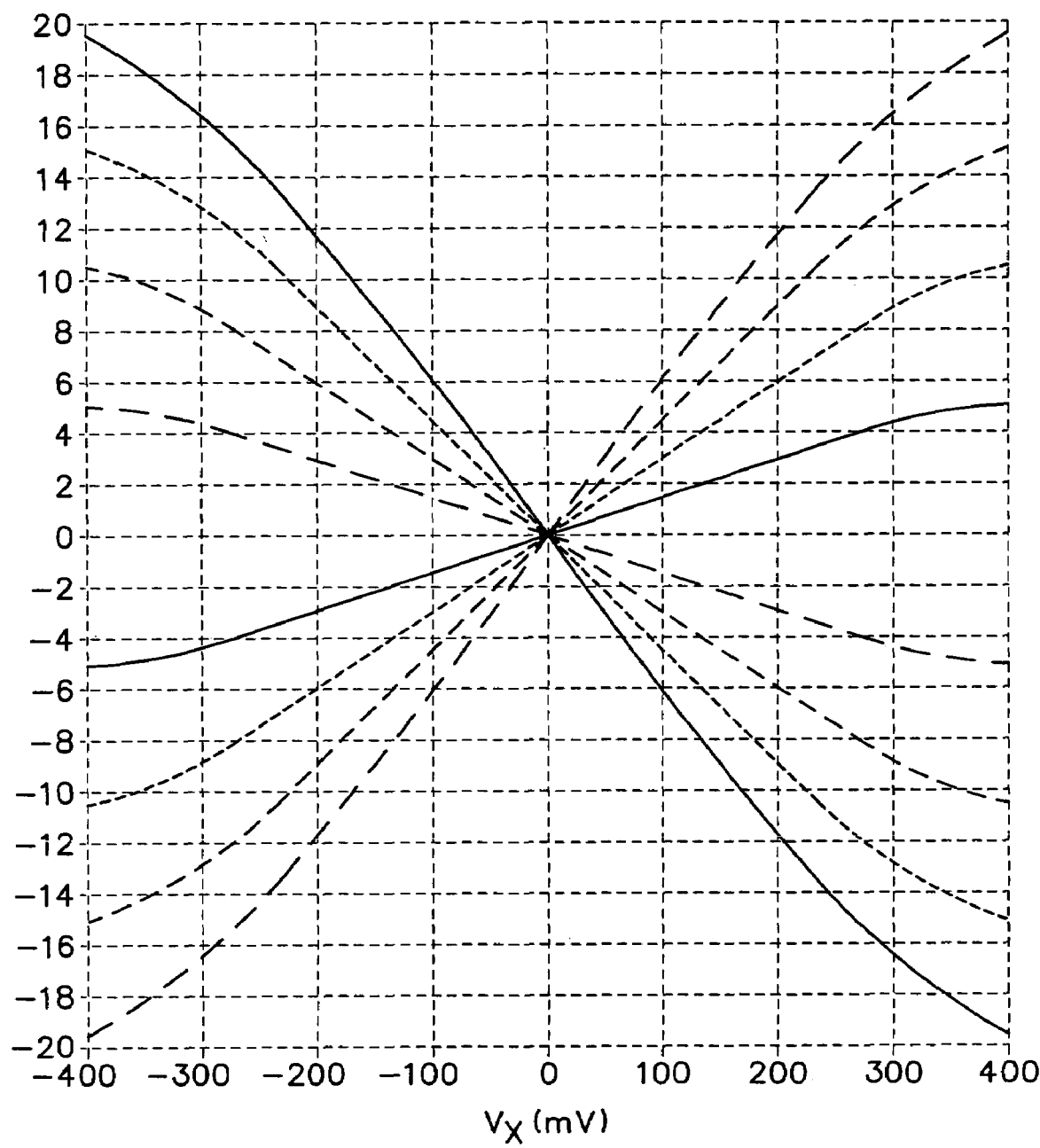
FIGS. 22 and 23 are simulation plots that illustrate the operation of the multiplier of FIG. 21.
Figure 23:
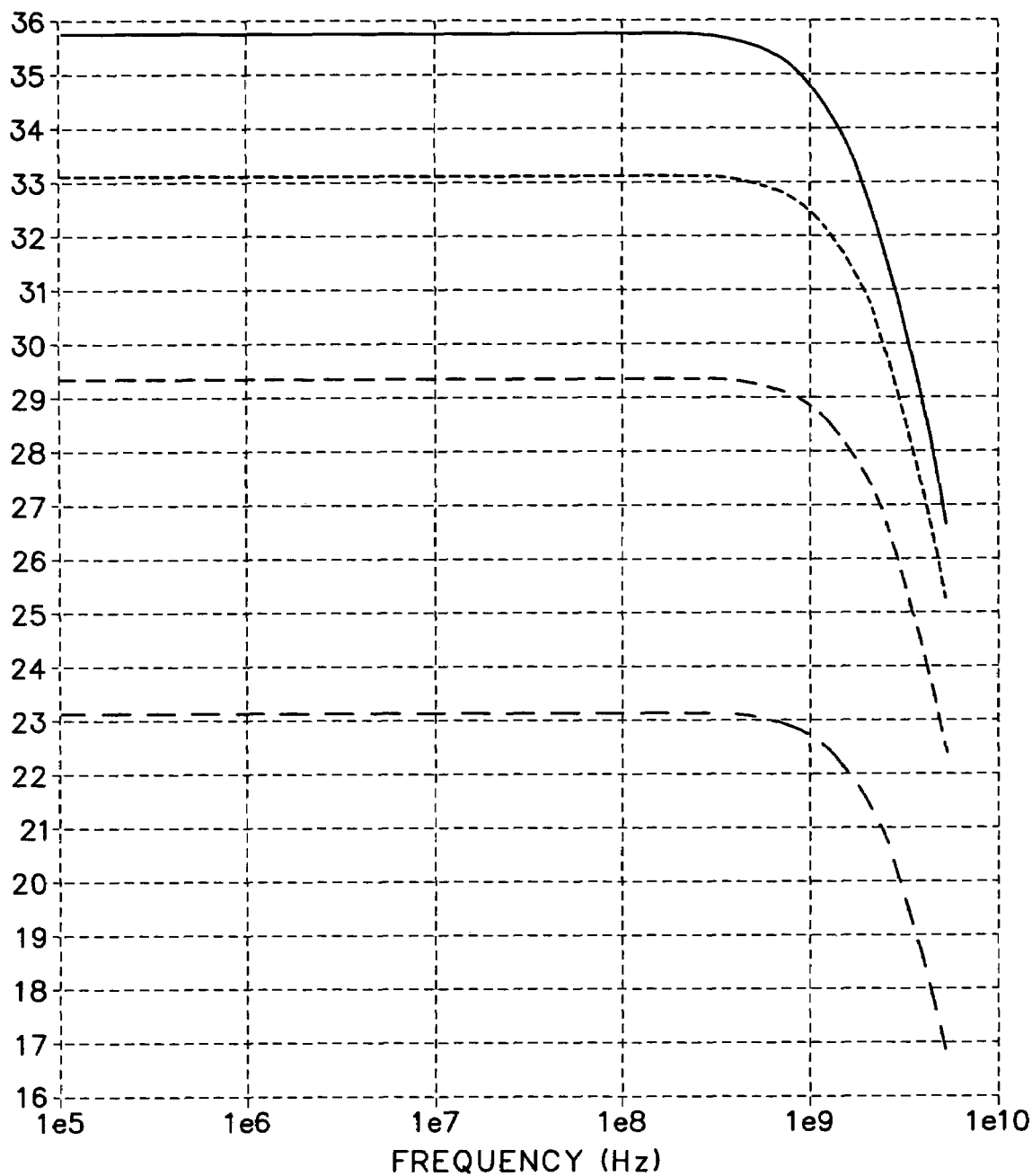

An advantage of the multiplier of FIG. 21 is that it can accommodate input signals up to about ±300 mV at T=27° C. FIGS. 22 and 23 are simulation plots that illustrate the operation of the multiplier of FIG. 21 where I0=100 µA and the NPN and PNP transistors have 0.8 µm by 10 µm emitters. FIG. 22 shows the output voltage $V_M$ as Vx is varied between −400 mV and +400 mV for several different values of Vy. As is apparent from FIG. 22, the multiplier maintains reasonably good linearity until the input signal reaches about ±300 mV.

FIG. 23 shows the incremental gain of the multiplier vs. frequency for Vy=50 mV, 100 mV, 150 mV, and 200 mV. The −3 dB points for these voltages are at 1.86 GHz, 2.21 GHz, 2.59 GHz, and 2.87 GHz, respectively.

When a squaring cell is used to measure a small input signal, the standing current (zero-signal current) should be as small as possible because, otherwise, the output signal is difficult to discern from the standing current. Additionally, when two squaring cells are used together, high standing currents exacerbate device mismatches and jeopardize the balance between the cells.

In the circuit of FIG. 20, the reduction in standing current that can be achieved by simply lowering $I_0$ is limited by the fact that $R_S$ cannot be made too large. Otherwise, the output of the squaring cell will become very linear in response to large input signals and the square-law behavior is lost.

Figure 24:
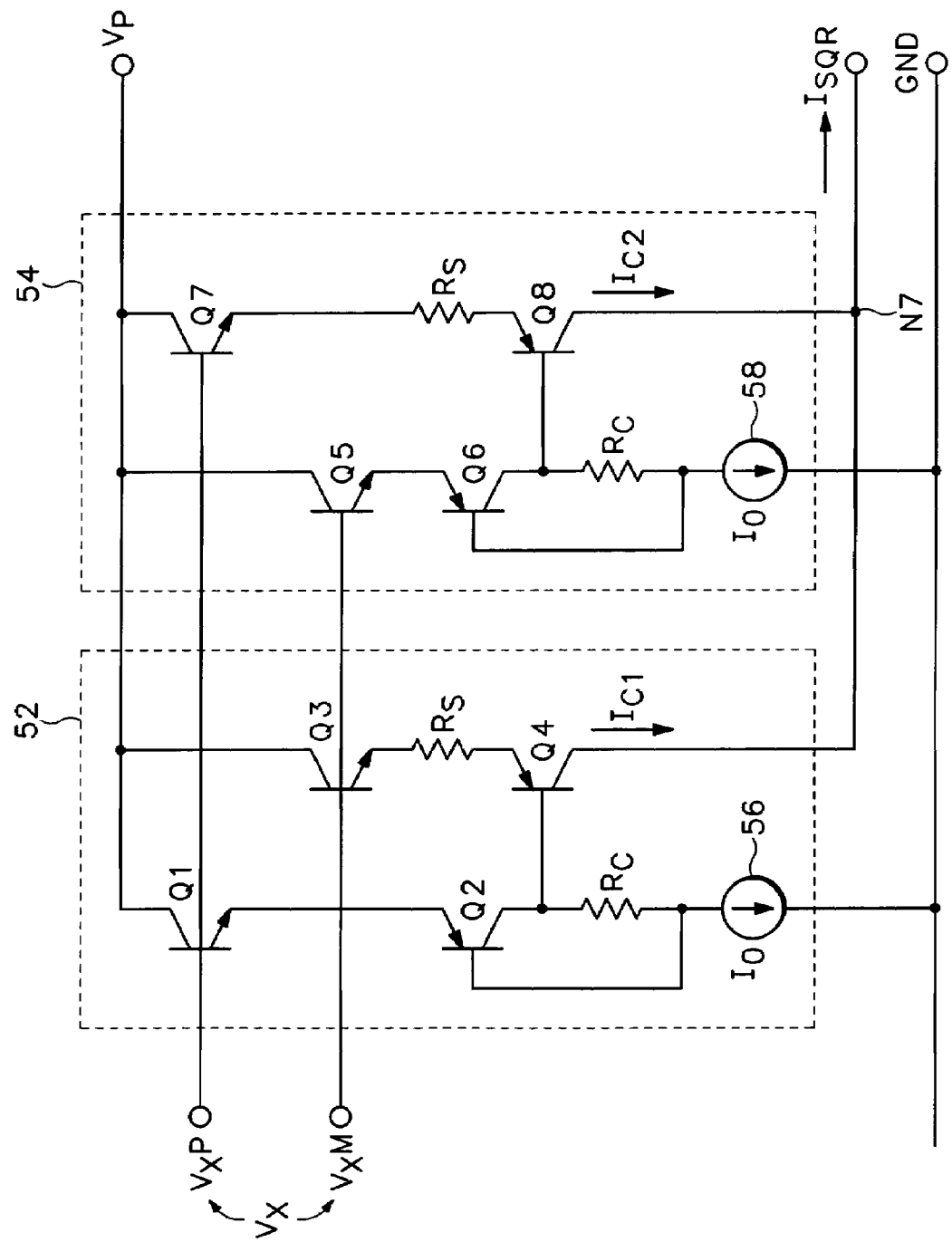
FIG. 24 is a schematic diagram of an embodiment of a squaring cell in accordance with the present invention.

This problem is overcome by the introduction of collector resistors $R_C$ in series with the collectors of Q2 and Q6 as shown in FIG. 24. The bases of Q2 and Q6 are then connected between $R_C$ and the corresponding current source. The voltage drop across the collector resistors, which serve to back-bias the entire arrangement, is independent of the input signal. By adding this precise voltage drop, the standing current can be reduced without significantly compromising the response to large input signals. Thus, the output signal caused by very small input signals can easily be discerned.

If the voltage drop across $R_C$ is made too large, the squaring cell will not respond accurately to small input signals. An optimum value will typically be about a few $V_T$, where $V_T$ is the thermal voltage (~26 mV at 300° K).

Having described and illustrated the principles of the invention in preferred embodiments thereof, it should be apparent that the invention can be modified in arrangement and detail without departing from such principles. For example, although the principles of the present invention have been illustrated with embodiments implemented with bipolar junction transistors (BJTs), it will be apparent that they can also be realized in different technologies, including CMOS, usually with fairly minor changes to the detailed design. We claim all modifications and variations coming within the spirit and scope of the following claims.

The invention claimed is:

1. A squaring cell comprising:
a first sub-exponential current generator for generating a first current responsive to an input signal; and
a second sub-exponential current generator for generating a second current responsive to the input signal;
wherein the first and second exponential current generators are coupled together to combine the first and second currents.

2. A squaring cell according to claim 1 wherein each of the sub-exponential current generators includes:
a constant current stack coupled to a first input terminal; and
a variable current stack coupled to a second input terminal and the constant current stack.

3. A squaring cell according to claim 1 wherein each of the sub-exponential current generators includes a back-bias component.

4. A squaring cell according to claim 1 wherein the first and second currents comprise substantially sub-exponential currents.

5. A method for squaring a signal comprising:
generating a first current which varies sub-exponentially responsive to the signal such that the first current increases when the signal increases;
generating a second current which varies sub-exponentially responsive to the signal such that the second current decreases when the signal increases; and
combining the first and second currents.

6. A method according to claim 5 further comprising adding a back-bias effect to the first and second currents.

7. A method for squaring a signal comprising:
generating a first current which varies sub-exponentially responsive to the signal such that the first current increases when the signal increases;
generating a second current which varies sub-exponentially responsive to the signal such that the second current decreases when the signal increases;
combining the first and second currents; and
scaling the first and second currents responsive to a control signal while generating and combining the first and second currents.

8. A method according to claim 7 further comprising adding a back-bias effect to the first and second currents.

9. A method according to claim 7 wherein the first and second currents vary substantially sub-exponentially.

10. A method for squaring a signal comprising:
generating a first current which varies exponentially responsive to the signal such that the first current increases when the signal increases;
generating a second current which varies exponentially responsive to the signal such that the second current decreases when the signal increases;
combining the first and second currents; and
altering the first and second currents so as to provide sub-exponential functions.

11. A method according to claim 10 further comprising adding a back-bias effect to the first and second currents.

12. A method according to claim 10 wherein the first and second currents vary substantially sub-exponentially.

13. A multiplier comprising:
a first sub-exponential current generator for generating a first current responsive to a first input signal and a second input signal;
a second sub-exponential current generator for generating a second current responsive to a third input signal and a fourth input signal;

a third sub-exponential current generator for generating a third current responsive to the first input signal and the fourth input signal; and a fourth sub-exponential current generator for generating a fourth current responsive to the third input signal and the second input signal;

wherein the first and second sub-exponential current generators are coupled together to combine the first and second currents; and wherein the third and fourth sub-exponential current generators are coupled together to combine the third and fourth currents.

14. A multiplier according to claim 13 wherein each of the sub-exponential current generators includes:
a constant current stack coupled to a first input terminal; and
a variable current stack coupled to a second input terminal and the constant current stack.

15. A multiplier according to claim 13 wherein each of the sub-exponential current generators includes a back-bias component.

16. A multiplier according to claim 13 wherein the first, second, third and fourth currents comprise substantially sub-exponential currents.

17. A method for multiplying a first signal and a second signal, wherein the first input signal is the difference between a first signal and a third signal, and the second input signal is the difference between a second signal and a fourth signal, the method comprising:
generating a first current which varies sub-exponentially responsive to the first signal and the second signal;
generating a second current which varies sub-exponentially responsive to the third signal and the fourth signal;
generating a third current which varies sub-exponentially responsive to the fourth signal and the first signal;
generating a fourth current which varies sub-exponentially responsive to the second signal and the third signal;
combining the first and second currents; and
combining the third and fourth currents.

18. A method according to claim 17 wherein:
combining the first and second currents includes summing the first and second currents; and
combining the third and fourth currents includes summing the third and fourth currents.

19. A method according to claim 17 further including scaling the first, second, third, and fourth currents responsive to a control signal while generating and combining the currents.

20. A method according to claim 17 further comprising adding a back-bias effect to the first, second, third and fourth currents.

21. A method according to claim 17 wherein the first, second, third and fourth currents vary substantially sub-exponentially.

22. A squaring cell comprising:
a first exponential current generator for generating a first current responsive to an input signal; and
a second exponential current generator for generating a second current responsive to the input signal;
wherein the first and second exponential current generators are coupled together to combine the first and second currents; and
wherein each of the exponential current generators includes:
a current source;
first and second junctions coupled in series between a first input terminal and the current source;
third and fourth junctions coupled in series between a second input terminal and a node;
a fifth junction coupled between the current source and the node; and
a resistor coupled between the node and the current source.

23. A squaring cell according to claim 22 wherein each of the exponential current generators further includes a second resistor coupled between the third and fourth junctions.

24. A squaring cell comprising:
a first exponential current generator for generating a first current responsive to an input signal; and
a second exponential current generator for generating a second current responsive to the input signal;
wherein the first and second exponential current generators are coupled together to combine the first and second currents;
wherein each of the exponential current generators includes:
a constant current stack coupled to a first input terminal; and
a variable current stack coupled to a second input terminal and the constant current stack; and
wherein each constant current stack comprises a resistor arranged to reduce the standing current through the stack.

25. A squaring cell comprising:
a first exponential current generator for generating a first current responsive to an input signal; and
a second exponential current generator for generating a second current responsive to the input signal;
wherein the first and second exponential current generators are coupled together to combine the first and second currents; and
wherein each of the exponential current generators includes:
a first transistor of a first polarity having a base coupled to a first input terminal for receiving a first side of the input signal;
a second transistor of a second polarity having an emitter coupled to an emitter of the first transistor, a base, and a collector coupled to a node;
a current source coupled to the base of the second transistor;
a third transistor of the first polarity having a base coupled to a second input terminal for receiving a second side of the input signal;
a fourth transistor of the second polarity having an emitter coupled to an emitter of the third transistor, and a base coupled to the node; and
a resistor coupled between the node and the current source.

* * * * *

UNITED STATES PATENT AND TRADEMARK OFFICE
CERTIFICATE OF CORRECTION

PATENT NO.        : 7,327,183 B2                                          Page 1 of 1
APPLICATION NO.   : 10/766514
DATED             : February 5, 2008
INVENTOR(S)       : Barrie Gilbert It is certified that error appears in the above-identified patent and that said Letters Patent is hereby corrected as shown below:

Column 3, line 35, the word "M2" should read -- M2, --;
Column 3, line 48, the word "mplified" should read -- amplified --;
Column 3, line 49, the word "source" should read -- sources $e_{nA}$ and $e_{nB}$ are not a separate part of the --;
Column 11, line 36, the word "Q1" should read -- Q11 --;
Column 15, line 19, the word "10" should read -- $I_0$ --.

Signed and Sealed this

Thirtieth Day of December, 2008

JON W. DUDAS
*Director of the United States Patent and Trademark Office*